(12) United States Patent
Sakamoto et al.

(10) Patent No.: US 8,236,679 B2
(45) Date of Patent: Aug. 7, 2012

(54) MANUFACTURING METHOD OF SEMICONDUCTOR MEMORY DEVICE USING INSULATING FILM AS CHARGE STORAGE LAYER

(75) Inventors: Wataru Sakamoto, Yokohama (JP); Mitsuhiro Noguchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 212 days.

(21) Appl. No.: 12/194,050

(22) Filed: Aug. 19, 2008

(65) Prior Publication Data
US 2009/0053885 A1 Feb. 26, 2009

(30) Foreign Application Priority Data
Aug. 22, 2007 (JP) ................................. 2007-216032

(51) Int. Cl.
*H01L 21/3205* (2006.01)
(52) U.S. Cl. .. 438/595; 438/585; 438/594; 257/E29.294
(58) Field of Classification Search .......... 438/585–595; 257/E21.294
See application file for complete search history.

(56) References Cited

U.S. PATENT DOCUMENTS

| | | | | |
|---|---|---|---|---|
| 5,908,309 | A * | 6/1999 | Andoh | 438/231 |
| 6,235,568 | B1 * | 5/2001 | Murthy et al. | 438/231 |
| 6,288,419 | B1 * | 9/2001 | Prall et al. | 257/213 |
| 6,525,367 | B1 * | 2/2003 | Moriyama | 257/314 |
| 6,611,010 | B2 | 8/2003 | Goda et al. | |
| 7,253,467 | B2 | 8/2007 | Lee et al. | |
| 2001/0018243 | A1 * | 8/2001 | Kim et al. | 438/221 |
| 2002/0106855 | A1 * | 8/2002 | Sato et al. | 438/241 |
| 2003/0049905 | A1 * | 3/2003 | Nitta et al. | 438/258 |
| 2006/0118858 | A1 | 6/2006 | Jeon et al. | |
| 2007/0029601 | A1 | 2/2007 | Orimoto et al. | |
| 2008/0093660 | A1 * | 4/2008 | Park et al. | 257/324 |

(Continued)

FOREIGN PATENT DOCUMENTS
JP 2002-141500 5/2002
(Continued)

OTHER PUBLICATIONS

Chang-Hyun Lee, et al., "Charge Trapping Memory Cell of TANOS (Si-Oxide-SiN-AL$_2$O$_3$-TaN) Structure Compatible to Conventional NAND Flash Memory", IEEE NVSMW, 2006, vol. 21, pp. 54-55.

(Continued)

*Primary Examiner* — David Vu
*Assistant Examiner* — Duy T Nguyen
(74) *Attorney, Agent, or Firm* — Oblon, Spivak, McClelland, Maier & Neustadt, L.L.P.

(57) ABSTRACT

A manufacturing method of a semiconductor memory device includes forming a first gate electrode having a charge storage layer, a block layer, and a control gate electrode on a first region of a semiconductor substrate, forming a second gate electrode on a second region of the semiconductor substrate, forming a protective insulating film on a side surface of the block layer, exposing the first region while covering the second region on the semiconductor substrate with a photoresist, using the photoresist, the first gate electrode, and the protective insulating film as masks to implant an impurity into the first region of the semiconductor substrate, and removing the photoresist by wet etching which uses a mixed solution containing $H_2SO_4$ and $H_2O_2$. The protective insulating film having an etching selective ratio of 1:100 or above with respect to the photoresist under wet etching conditions using the mixed solution.

20 Claims, 11 Drawing Sheets

U.S. PATENT DOCUMENTS

2008/0230842 A1* 9/2008 Oji .................. 257/371

FOREIGN PATENT DOCUMENTS

| | | |
|---|---|---|
| JP | 2003-68897 | 3/2003 |
| JP | 2003-86718 | 3/2003 |
| JP | 2004-39866 | 2/2004 |
| JP | 2004-158810 | 6/2004 |
| JP | 2005-142354 | 6/2005 |
| JP | 2006-013092 * | 1/2006 |
| JP | 2007-142468 | 6/2007 |
| WO | WO 2004/021399 A1 | 3/2004 |

OTHER PUBLICATIONS

Korean Office Action with English Translation dated Jul. 30, 2010.

* cited by examiner

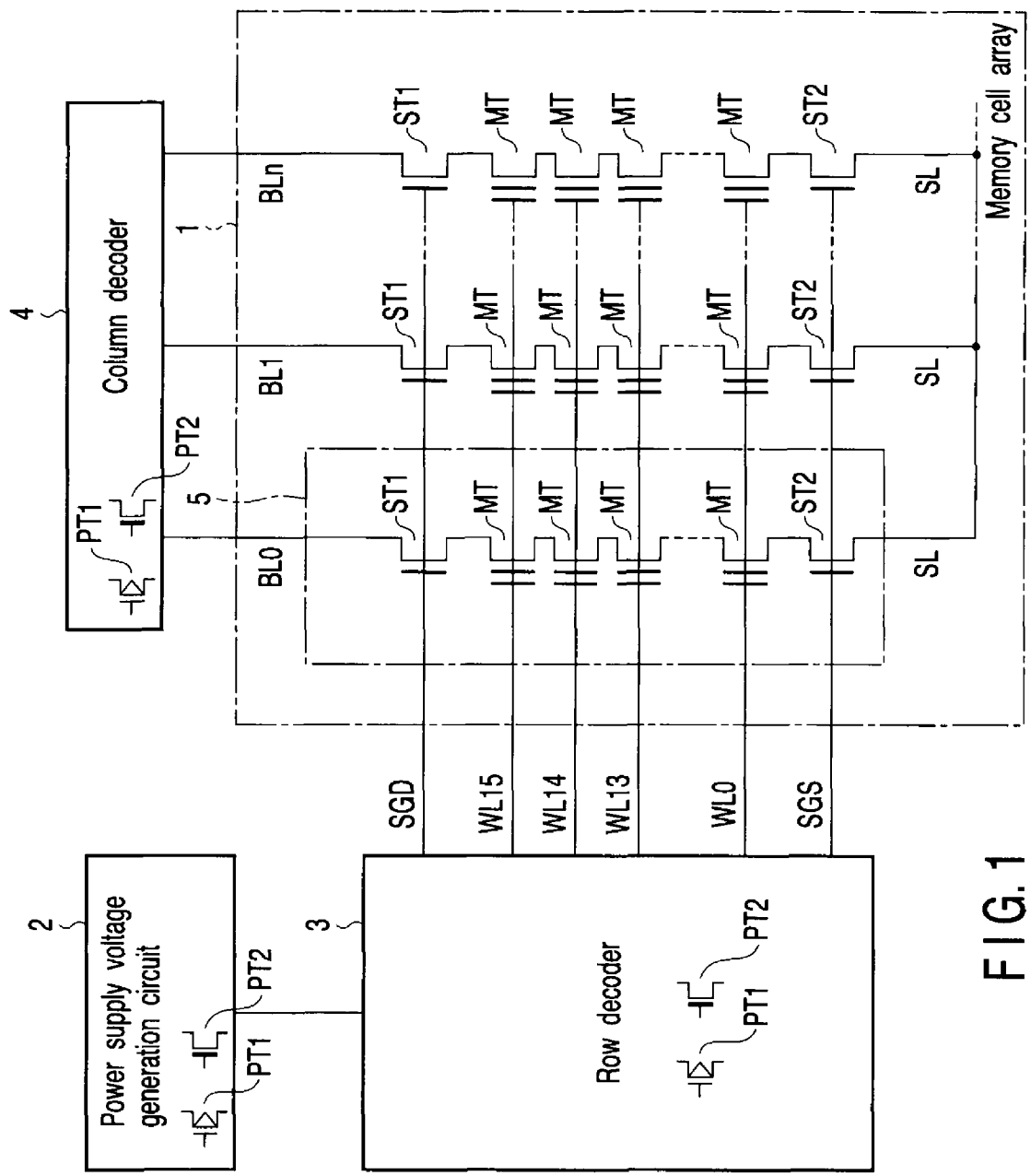
F I G. 1

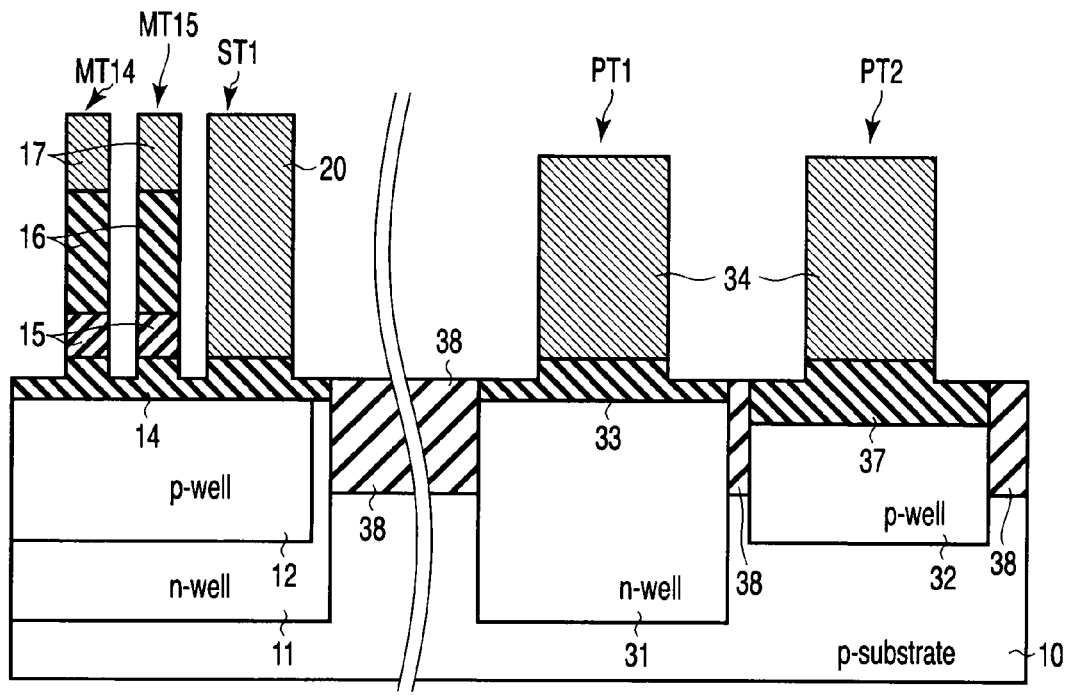
F I G. 4
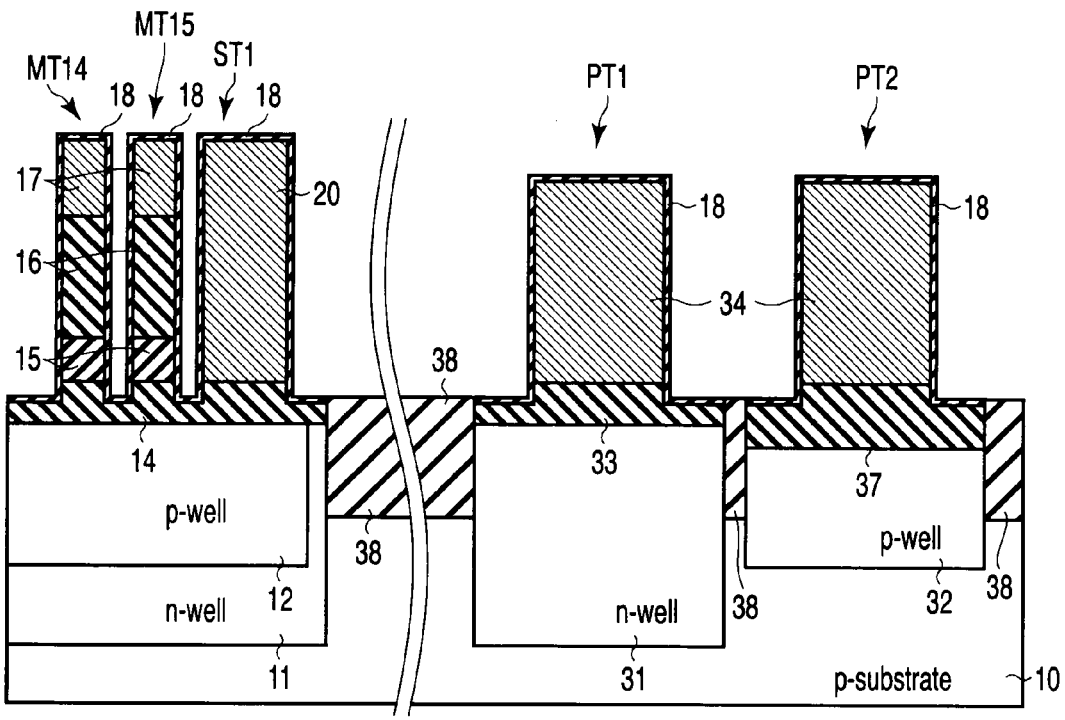
F I G. 5

MANUFACTURING METHOD OF SEMICONDUCTOR MEMORY DEVICE USING INSULATING FILM AS CHARGE STORAGE LAYER

CROSS-REFERENCE TO RELATED APPLICATIONS

This application is based upon and claims the benefit of priority from prior Japanese Patent Application No. 2007-216032, filed Aug. 22, 2007, the entire contents of which are incorporated herein by reference.

BACKGROUND OF THE INVENTION

1. Field of the Invention

The present invention relates to a manufacturing method of a semiconductor memory device. More particularly, the present invention relates to a nonvolatile memory using an insulating film as a charge storage layer.

2. Description of the Related Art

As a structure of a memory cell transistor in a nonvolatile memory, a metal oxide nitride oxide semiconductor (MONOS) type structure has been conventionally known. The MONOS type structure is a structure having: a charge storage layer (e.g., an insulating film) formed on a silicon substrate through an insulating film; an insulating film which is formed on the charge storage layer and has a higher dielectric constant than the charge storage layer (which will be referred to as a block layer hereinafter); and a control gate electrode formed on the block layer (see, e.g., "Charge Trapping Memory Cell of TANOS (Si-Oxide-SiN—$Al_2O_3$—TaN) Structure Compatible to Conventional NAND Flash Memory," IEEE NVSMW 2006. $21^{st}$ Volume, Issue 2006 pp. 54-55).

The nonvolatile memory requires peripheral transistors constituting, e.g., a power supply generation circuit or a decoder circuit besides the memory cell transistors. An impurity that is implanted into the silicon substrate and energy that is used to implant the impurity vary depending on the types of these transistors. Therefore, the memory cell transistor is protected by, e.g., a photoresist when, e.g., forming the peripheral transistors. Therefore, the memory cell transistor is exposed to wet etching that is performed to remove, e.g., a photoresist more than once.

During this wet etching, not only the photoresist but also the block layer of the memory cell transistor may be simultaneously etched in some cases. As a result, the memory cell transistor having the etched block layer has a problem of degradation in characteristics of the nonvolatile memory, e.g., a reduction in a data writing speed or erasing speed.

BRIEF SUMMARY OF THE INVENTION

According to a first aspect of the present invention, there is provided a manufacturing method of a semiconductor memory device comprising:

forming a first gate electrode having a charge storage layer, a block layer, and a control gate electrode on a first region of a semiconductor substrate through a first gate insulating film;

forming a second gate electrode on a second region of the semiconductor substrate through a second gate insulating film;

forming a protective insulating film on a side surface of the block layer;

applying a photoresist to an upper side of the semiconductor substrate to expose the first region while covering the second region;

using the photoresist, the first gate electrode, and the protective insulating film as masks to implant an impurity into the first region of the semiconductor substrate; and removing the photoresist by wet etching which uses a mixed solution containing $H_2SO_4$ and $H_2O_2$, wherein the protective insulating film has an etching selective ratio of 1:100 or above with respect to the photoresist under wet etching conditions using the mixed solution.

According to a second aspect of the present invention, there is provided a manufacturing method of a semiconductor memory device comprising:

forming a plurality of first gate electrodes each having a charge storage layer, a block layer, and a control gate electrode on a first region of a semiconductor substrate through a first gate insulating film;

forming a plurality of second gate electrodes on a second region of the semiconductor substrate through a second gate insulating film;

forming a protective insulating film on at least side surfaces of the block layers of the plurality of first gate electrodes and side surfaces of the plurality of second gate electrodes;

applying a first photoresist to an upper side of the semiconductor substrate to expose the first region while covering the second region;

using the first photoresist, the plurality of first gate electrodes, and the protective insulating film as masks to implant an impurity into the first region of the semiconductor substrate;

removing the first photoresist by wet etching which uses a mixed solution containing $H_2SO_4$ and $H_2O_2$;

applying a second photoresist to an upper side of the semiconductor substrate to expose the second region while covering the first region;

using the second photoresist, the plurality of second gate electrodes, and the protective insulating film as masks to implant an impurity into the second region of the semiconductor substrate; and removing the second photoresist by wet etching which uses a mixed solution containing $H_2SO_4$ and $H_2O_2$, wherein the protective insulating film has an etching selective ratio of 1:100 or above with respect to the first and second photoresists under wet etching conditions using the mixed solution.

BRIEF DESCRIPTION OF THE SEVERAL VIEWS OF THE DRAWING

FIG. 1 is a block diagram showing a structural example of a semiconductor memory device (a NAND type flash memory) according to a first embodiment of the present invention;

FIG. 4 is a cross-sectional view for explaining a first manufacturing step of the NAND type flash memory according to the first embodiment;

FIG. 5 is a cross-sectional view for explaining a second manufacturing step of the NAND type flash memory according to the first embodiment;

DETAILED DESCRIPTION OF THE INVENTION

Figure 2:
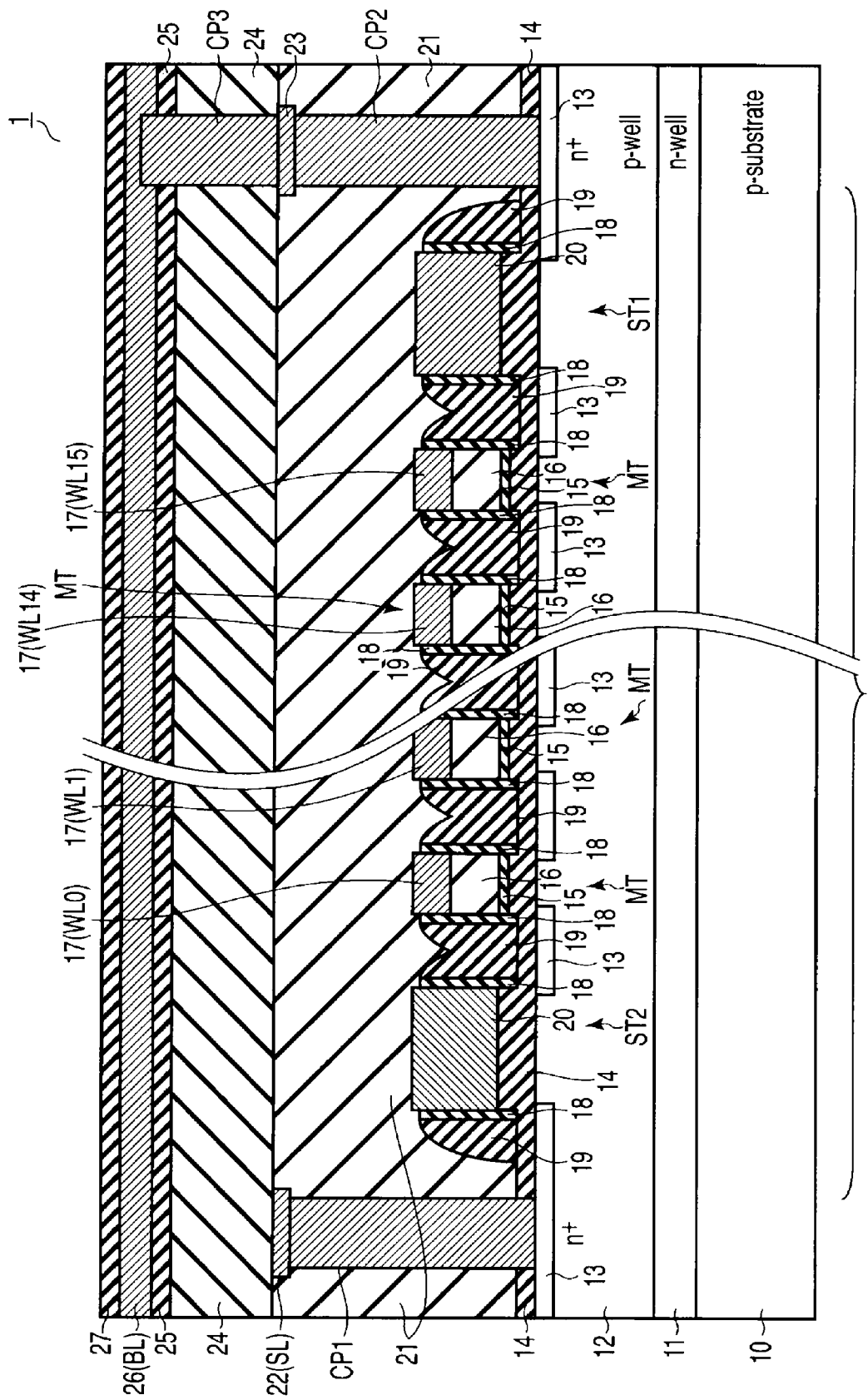
FIG. 2 is a cross-sectional view showing a structural example of a memory cell array in the NAND type flash memory according to the first embodiment.

Embodiments of the present invention will be described with reference to the accompanying drawings. It should be noted that the drawings are schematic ones and the dimension ratios shown therein are different from the actual ones. The dimensions vary from drawing to drawing and so do the ratios of dimensions. The following embodiments are directed to a device and a method for embodying the technical concept of the present invention and the technical concept does not specify the material, shape, structure or configuration of components of the present invention. Various changes and modifications can be made to the technical concept without departing from the scope of the claimed invention.

First Embodiment

A manufacturing method of a semiconductor memory device according to a first embodiment of the present invention will now be explained with reference to FIG. 1. It is to be noted that a NAND type flash memory will be explained as an example in this embodiment.

As shown in the drawing, a NAND type flash memory includes a memory cell array 1, a power supply voltage generation circuit 2, a row decoder 3, and a column decoder. First, the memory cell array 1 will be explained.

As shown in the drawing, the memory cell array 1 includes a plurality of NAND cells 5. Each of the NAND cells 5 includes a plurality of (e.g., 16) nonvolatile memory cell transistors MT connected in series, and selective transistors ST1 and ST2. Each memory cell transistor MT includes a MONOS type structure having a charge storage layer (e.g., an insulating film) formed on a semiconductor substrate through a gate insulating film, an insulating film (a block layer) that is formed on the insulating film and that has a higher dielectric constant than the charge storage layer, and a control gate electrode formed on the block. It is to be noted that the number of the memory cell transistors MT may be eight, 32, 64, 128, or 256 without being restricted to 16, and this number is not limited. Further, the memory cell transistors MT adjacent to each other share a source region and a drain region.

That is, the respective memory cell transistors MT are arranged in such a manner that current paths can be connected in series between the selective transistors ST1 and ST2. Furthermore, a drain region on one end side of the memory cell transistors MT connected in series is connected with a source region of the selective transistor ST1, and a source region on the other end side of the same is connected with a drain region of the selective transistor ST2.

The control gate electrode of each memory cell transistor MT in the same row is connected with one of word lines WL0 to WL15 in common, and the gate electrode of the selective transistor ST1 or ST2 in the same column is connected with a selective gate line SGD or SGS in common, respectively. It is to be noted that the word lines WL0 to WL15 may be simply referred to as word lines WL hereinafter to simplify the explanation. Furthermore, a drain region of the selective transistor ST1 in the same column is connected with one of bit lines BL0 to BLn (n is a natural number) in common. The bit lines BL0 to BLn may be likewise generically referred to as bit lines BL hereinafter when these lines are not discriminated. A source region of the selective transistor ST2 is connected with a source line SL in common. It is to be noted that both the selective transistors ST1 and ST2 are not necessarily required, and one of the transistors can suffice if the NAND cell 5 can be selected.

FIG. 1 shows the NAND cell 5 for one row alone. However, the NAND cells 5 for a plurality of rows may be provided in the memory cell array. In such a case, the NAND cells 5 in the same column are connected with the same bit line BL. Moreover, data is collectively written in the plurality of memory cell transistors MT connected with the same word line WL, and this unit will be referred to as a page. Additionally, data in the plurality of NAND cells 5 in the same row is collectively erased, and this unit will be referred to as a memory block.

The row decoder 3 selects a row direction of the memory cell array 1. That is, the row decoder 3 selects the word line WL and applies a voltage to the selected word line WL. The column decoder 4 selects a column direction of the memory cell array 1. That is, the column decoder 4 selects the bit line BL. The power supply voltage generation circuit 2 generates a voltage and supplies the generated voltage to the row decoder 3.

Each of the power supply voltage generation circuit 2, the row decoder 3, and the column decoder 4 includes, e.g., a low-breakdown-voltage MOS transistor and a high-breakdown-voltage MOS transistor. The low-breakdown-voltage MOS transistor uses a voltage VDD (e.g., 1.5V) as a power supply voltage. The high-breakdown-voltage MOS transistor uses a voltage VPP (e.g., 20V), which is higher than the power supply voltage (the voltage VDD) of the low-breakdown-voltage MOS transistor as a power supply voltage. To simplify the explanation, a p-channel MOS transistor alone will be explained as the low-breakdown-voltage MOS transistor, an n-channel MOS transistor alone will be explained as the high-breakdown-voltage MOS transistor, and these transistors will be referred to as peripheral transistors PT1 and PT2.

A structure of the memory cell array 1 will now be explained with reference to FIG. 2. FIG. 2 shows a cross section of the NAND cell 5 along a wiring direction of the bit line BL. An n-type well region (an n-well) 11 is formed in a surface region of a p-type semiconductor substrate (a p-substrate) 10. A p-type well region (a p-well) 12 is formed in a surface region of the n-type well region 11. A gate insulating film 14 is formed on the p-type well region 12, and gate electrodes of the memory cell transistors MT are formed on the gate insulating film 14. The gate electrode of each memory cell region MT has a MONOS type structure in which an insulating film 15 formed on the gate insulating film 14, an insulating film 16 that is formed of a material with a higher dielectric constant than a material used for the gate insulating film (e.g., a silicon oxide film) on the insulating film 15, and a polysilicon layer 17 formed on the insulating film 16 are laminated. A surface of the polysilicon layer 17 is silicided. The insulating film 15 functions as a charge storage layer that stores electric charges, the insulating film 16 serves as a block layer that confines electric charges to the insulating film 15, and the polysilicon layer 17 functions as a control gate electrode. The insulating films 15 and 16 and the polysilicon layer 17 may be referred to as a charge storage layer 15, a block layer 16, and a control gate electrode 17, respectively. Further, a polysilicon layer 20 that serves as a gate electrode of each of the selective transistors ST1 and ST2 is formed on the gate insulating film 14. A surface of the polysilicon layer 20 is likewise silicided. The polysilicon layer 20 may be simply referred to as a gate electrode 20 hereinafter.

Furthermore, an insulating film 18 is formed on a sidewall of the gate electrode of each memory cell transistor MT. That is, the insulating film 18 is formed on side surfaces of the charge storage layer 15, the block layer 16, and the control gate electrode 17. It is to be noted that covering an entire side surface of at least the block layer 16 with the insulating film 18 can suffice, and the insulating film 18 is not necessarily required for the side surfaces of the charge storage layer 15 and the control gate electrode 17. Moreover, the insulating film 18 is also formed on side surfaces of the gate electrodes 20 of the selective transistors ST1 and ST2.

In the structure shown in FIG. 2, a film thickness of the gate insulating film 14 placed immediately below the gate electrode of each memory cell transistor MT and the gate electrode 20 of each selective transistor ST1 or ST2 is larger than a film thickness of the gate insulating film 14 placed between the gate electrodes. That is, steps are formed in the gate insulating film 14 at positions where the film thickness varies, and the insulating film 18 is also formed on sidewalls of such step portions.

Additionally, an insulating film 19 is formed on the gate insulating film 14 between the gate electrodes of the memory cell transistors MT and the selective transistors ST1 and ST2. That is, the region between adjacent gate electrodes is filled with the insulating film 19. An upper surface of the insulating film 19 is substantially level with an upper surface of the insulating film 18, and a side surface of the insulating film 18 is completely covered with the insulating film 19.

In the memory cell transistors MT, the control gate electrodes 17 which are adjacent to each other in a direction perpendicular to the bit line BL are connected in common to function as the word line WL. In the selective transistors ST1 and ST2, likewise, the gate electrodes 20 which are adjacent to each other in the direction perpendicular to the bit line BL are connected in common. Further, the gate electrodes 20 function as either the selective gate line SGS or SGD.

An $n^+$-type impurity diffusion layer 13 is formed in a surface of the p-type well region 12 placed between the gate electrodes. This $n^+$-type impurity diffusion layer 13 is shared by the transistors which are adjacent to each other, and functions as a source (S) region or a drain (D) region. Furthermore, a region between the source region and the drain region adjacent to each other below the gate electrodes serves as a channel region that becomes an electron movement region. The control gate electrode 17, the $n^+$-type impurity diffusion layer 13, and the channel region form an MOS transistor that functions as the memory cell transistor MT. Moreover, the gate electrode 20, the $n^+$-type impurity diffusion layer 13, and the channel region form the MOS transistor that functions as the selective transistor ST1 or ST2.

An interlayer insulating film 21 is formed on the p-type semiconductor substrate 10 to cover the memory cell transistors MT and the selective transistors ST1 and ST2. A contact plug CP1 that reaches the $n^+$-type impurity diffusion layer (the source region) 13 of the selective transistor ST2 on the source side is formed in the interlayer insulting film 21. Further, a metal wiring layer 22 connected with the contact plug CP1 is formed on a surface of the interlayer insulating film 21. The metal wiring layer 22 functions as a part of the source line SL. Furthermore, a contact plug CP2 reaching the $n^+$-type impurity diffusion layer (the drain region) 13 of the selective transistor ST1 on the drain side and a metal wiring layer 23 connected with the contact plug CP2 are formed in the interlayer insulating film 21. An interlayer insulating film 24 is formed on the interlayer insulating film 21. An interlayer insulating film 25 is formed on the interlayer insulating film 24. A metal wiring layer 26 is formed on the interlayer insulating film 25. The metal wiring layer 26 functions as the bit line BL. A contact plug CP3 having an upper surface that is in contact with the metal wiring layer 26 and a bottom surface that is in contact with the metal wiring layer 23 is formed in the interlayer insulating films 24 and 25. An insulating film 27 is formed on the metal wiring layer 26.

Figure 3:
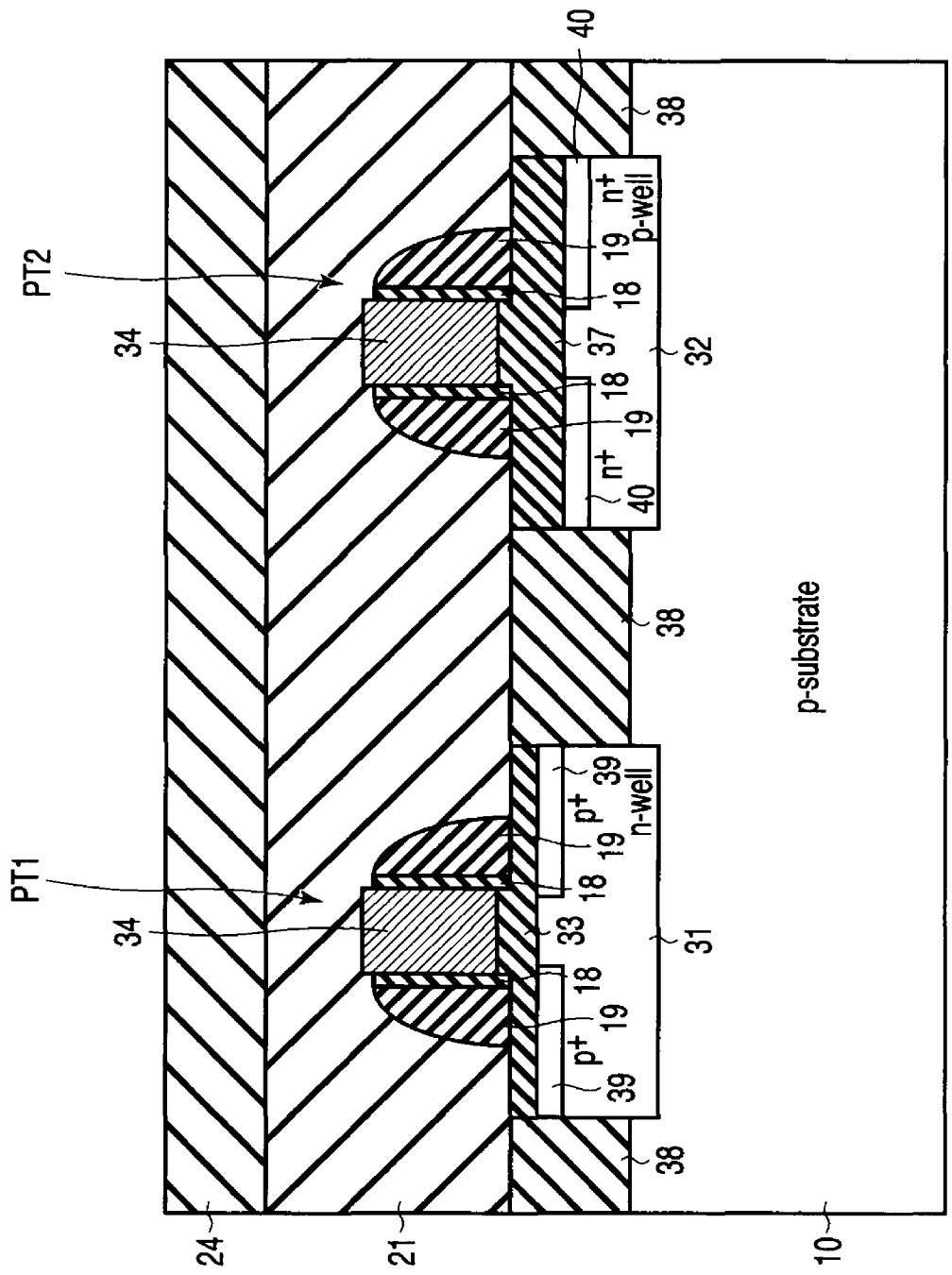
FIG. 3 is a cross-sectional view showing a structural example of peripheral transistors in the NAND type flash memory according to the first embodiment.

The peripheral transistors PT1 and PT2 constituting each of the power supply voltage generation circuit 2, the row decoder 3, and the column decoder 4 will now be explained with reference to FIG. 3. FIG. 3 is a cross-sectional view of the peripheral transistors PT1 and PT2. As shown in the drawing, the peripheral transistors PT1 and PT2 are formed on the same p-type semiconductor substrate 10 as that of the memory cell array 1.

An n-type well region (an n-well) 31 and a p-type well region (a p-well) 32 are formed in a surface region of the p-type semiconductor substrate 10. The n-type well region 31 and the p-type well region 32 are surrounded by an element isolating region 38 and electrically separated from each other. Furthermore, the low-breakdown-voltage peripheral transistor PT1 is formed on the n-type well region 31, and the high-breakdown-voltage peripheral transistor PT2 is formed on the p-type well region 32.

That is, a gate insulating film 33 is formed on the n-type well region 31. Moreover, a gate electrode 34 of the peripheral transistor PT1 is formed on the gate insulating film 33. Additionally, a gate insulating film 37 is formed on the p-type well region 32, and a gate electrode 34 of the peripheral transistor PT2 is formed on the gate insulating film 37. A film thickness of the gate insulating film 37 of the peripheral transistor PT2 is larger than a film thickness of the gate insulating film 33 of the peripheral transistor PT1. That is because a higher voltage is applied to the peripheral transistor PT2 as compared with the peripheral transistor PT1. Further, a step where a film thickness of the gate insulating film 33 or 37 immediately below the gate electrode 34 of the peripheral transistor PT1 or PT2 becomes larger than a film thickness of the same at any other position is formed on a surface of each of the gate insulating films 33 and 37. Furthermore, an insulating film 18 is formed on sidewalls of the gate electrodes 34 of the peripheral transistors PT1 and PT2. The insulating film 18 is also formed on sidewalls of the step portions of the gate insulating films 33 and 37 like the insulating film 18 formed on the gate electrodes of the memory cell transistors MT and the gate electrodes 20 of the selective transistors ST1 and ST2. A side surface of the insulating film 18 is completely covered with an insulating film 19.

A p$^+$-type impurity diffusion layer 39 that functions as a source region or a drain region of the peripheral transistor PT1 is formed in the surface of the n-type well region 31. Moreover, an n$^+$-type impurity diffusion layer 40 that functions as a source region or a drain region of the peripheral transistor PT2 is formed in the surface of the p-type well region 32. The impurity diffusion layers 39 and 40 are connected with non-illustrated contact plugs, and voltages are applied to these layers through the contact plugs. Additionally, a region between the source region and the drain region adjacent to each other immediately below the gate electrode 34 functions as a channel region that becomes an electron or hole movement region. The gate electrode 34, the impurity diffusion layer 39 or 40, and the channel region form an MOS transistor that serves as the peripheral transistor PT1 or PT2. It is to be noted that an impurity concentration profile of the impurity diffusion layer 39 or 40 in a depth direction of the p-type semiconductor substrate 10 varies depending on characteristics required for the peripheral transistor PT1 or PT2. The impurity concentration profile of the impurity diffusion layer 39 or 40 is different from an impurity concentration profile of the n$^+$-type impurity diffusion layer 13 of the memory cell transistor MT.

An interlayer insulating film 21 is formed on the p-type semiconductor substrate 10 to cover the peripheral transistors PT1 and PT2 that are placed to sandwich the element isolating region 38 therebetween. An interlayer insulating film 24 is formed on the interlayer insulating film 21. Further, non-contact plugs are buried to pierce the interlayer insulating films 21 and 24.

A manufacturing method of the memory cell array 1 and the peripheral transistors PT1 and PT2 will now be explained with reference to FIGS. 4 to 9. FIGS. 4 to 9 are cross-sectional views sequentially showing manufacturing steps of the memory cell array 1 and the peripheral transistors PT1 and PT2 according to this embodiment. It is to be noted that, in regard to the memory cell array 1, the memory cell transistors MT14 and MT15 and the selective transistor ST1 alone are depicted.

As shown in FIG. 4, first, the n-type well region 11 is formed in the surface of the p-type semiconductor substrate 10 corresponding to a region where formation of the memory cell array 1 is planned, and then the p-type well region 12 is formed in the surface of the n-type well region 11. The n-type well region 31 and the p-type well region 32 are formed on the surface of the p-type semiconductor substrate 10 corresponding to regions where formation of the peripheral transistors PT1 and PT2 is planned. The p-type well regions 12 and 32 and the n-type well regions 11 and 31 are formed to have appropriate impurity types and concentration profiles in accordance with characteristics required for the respective transistors. The impurity concentration profiles of the p-type well region 12, where the memory cell array 1 is formed, and the well regions 31 and 32, where the peripheral transistors PT1 and PT2 are formed in a depth direction, are usually different from each other. Further, since the well region where the low-breakdown-voltage peripheral transistor is formed, and the well region where the high-breakdown-voltage peripheral transistor is formed have different breakdown voltages required for the transistors, it is general to form the transistors by using different impurities even though the transistors have the same conductivity type.

Furthermore, the element isolating regions 38 are formed in the p-type semiconductor substrate 10 by using, e.g., a shallow trench isolation (STI) technology. As a result, the n-type well regions 11 and 31 and the p-type well region 32 are electrically separated from each other through the element isolating regions 38.

Then, the gate electrodes of the memory cell transistors MT, the gate electrodes 20 of the selective transistors ST1 and ST2, and the gate electrodes 34 of the peripheral transistors PT1 and PT2 are formed in the region where formation of the memory cell array 1 is planned and the regions where formation of the peripheral transistors PT1 and PT2 is planned on the p-type semiconductor substrate 10, respectively. That is, first, the gate insulating film 14, which is made of, e.g., $SiO_2$, is formed on the n-type well region 11 including the p-type well region 12. The gate insulating film 14 functions as a tunnel insulating film in each memory cell transistor MT. Subsequently, the insulating films 15 and 16, and the polysilicon layer 17 are formed on the gate insulating film 14. The insulating film 15 is, e.g., one of an SiN single layer film, an HfAlO single layer film, and a laminated film including a high-dielectric-constant film having a higher dielectric constant than a silicon oxide film. It is to be noted that the high-dielectric-constant film is formed of one of $Al_2O_3$, MgO, SrO, BaO, TiO, $Ta_2O_5$, $BaTiO_3$, BaZrO, $ZrO_2$, $HfO_2$, $Y_2O_3$, ZrSiO, HfSiO, and LaAlO, and may have a lamination layer structure containing these materials. Moreover, the laminated film may have one of a structure where an SiN film, a high-dielectric-constant film, and the SiN film are sequentially laminated on the gate insulating film 14, a structure where an HfAlO film, the high-dielectric-constant film, and the SiN film are sequentially laminated on the same, a structure where the SiN film, the high-dielectric-constant film, and the HfAlO film are sequentially laminated on the same, and a structure where the HfAlO film, the high-dielectric-constant film, and the HfAlO film are sequentially laminated on the same. Additionally, the insulating film 16 is formed of a material having a higher dielectric constant than a material used for the gate insulating film 14. Specifically, the material of the insulating film 16 is either a high-dielectric-constant film having a higher dielectric constant than a silicon oxide film, a laminated film including a silicon oxide film, or a high-dielectric-constant film. The high-dielectric-constant film is formed of one of $Al_2O_3$, MgO, SrO, SiN, BaO, TiO, $Ta_2O_5$, $BaTiO_3$, BaZrO, $ZrO_2$, $HfO_2$, $Y_2O_3$, ZrSiO, HfSiO, and LaAlO, or may have a lamination layer structure containing any of these materials. The laminated film may have one of a structure where the silicon oxide film, the high-dielectric-constant film, and the silicon oxide film are sequentially laminated on the insulating film 15, a structure where the silicon oxide film and the high-dielectric-constant film are sequentially laminated on the same, a structure where the high-dielectric-constant film and the silicon oxide film are sequentially laminated on the same, and a structure where the high-dielectric-constant film, the silicon oxide film, and the high-dielectric-constant film are sequentially laminated on the same.

Thereafter, each of the polysilicon layer 17 and the insulating films 16 and 15 are patterned into a pattern of the gate electrode of the memory cell transistor MT by using a photolithography technology and anisotropic etching, e.g., a reactive ion etching (RIE) method. At this time at least a part of the gate insulating film 14 may be etched. As a result, as shown in FIG. 4, the gate electrode of each memory cell transistor MT in which the insulating film 15 serving as a charge storage layer, the insulating film 16 functioning as a block layer, and the polysilicon layer 17 serving as a control gate electrode are sequentially laminated is brought to completion.

The gate electrode 20 of each selective transistor ST1 and ST2 is formed by, e.g., the following method. That is, the polysilicon layer 20 is formed on the gate insulating film 14. Then, the polysilicon layer 20 is patterned into a desired pattern by photolithography and RIE, thereby bringing the gate electrode 20 to completion.

The gate electrodes 34 of the peripheral transistors PT1 and PT2 are also formed by the same method as the gate electrode 20 of the selective transistor ST1 or ST2. That is, after forming the gate insulating films 33 and 37, the polysilicon layers are formed on the gate insulating films 33 and 37. Thereafter, the polysilicon layers are patterned into desired patterns based on the photolithography technology and RIE, thereby bringing the gate electrodes 34 to completion.

It is to be noted that the gate electrodes of the memory cell transistors MT, the gate electrodes 20 of the selective transistors ST1 and ST2, and the gate electrodes 34 of the peripheral transistors PT1 and PT2 may be simultaneously formed. For example, after forming the gate insulating films 14, 33, and 37, the insulating films 15 and 16 are formed on the entire surface of the p-type semiconductor substrate 10. Then, the insulating films 15 and 16 are left in a region where the memory cell transistors MT are planned to be formed but are removed in any other region by photolithography and etching. Subsequently, the polysilicon layer is formed on the entire surface. The polysilicon layer becomes the control gate electrode 17 and the gate electrodes 20 and 34. Then, the polysilicon layer and the insulating films 15 and 16 are etched, thereby bringing the gate electrodes of the respective transistors to completion.

With the above-explained steps, as shown in FIG. 4, the gate electrodes (the MONOS type structure) of the memory cell transistors MT and the gate electrodes 20 and 34 of the selective transistors ST1 and ST2 and the peripheral transistors PT1 and PT2 are brought to completion. It is to be noted that a film thickness of the gate insulating film 33 of the low-breakdown-voltage peripheral transistor PT1 is not necessarily equal to a film thickness of the gate insulating film 14 of the memory cell transistor MT. A film thickness of the gate insulating film 37 of the high-breakdown-voltage peripheral transistor PT2 is set to, e.g., approximately 30 nm, which is larger than film thicknesses of the gate insulating films 14 and 33, to provide resistance against the voltage VPP. In particular, in the row decoder 3, a high-breakdown-voltage MOS transistor is used for a MOS transistor that is present in a path through which the voltage VPP is applied to the word line WL when, e.g., writing data.

Then, as shown in FIG. 5, the insulating film 18 is formed on side surfaces and upper surfaces of the gate electrodes of the memory cell transistors MT, side surfaces and upper surfaces of the gate electrodes 20 of the selective transistors ST1 and ST2, side surfaces and upper surfaces of the gate electrodes 34 of the peripheral transistors PT1 and PT2, and the gate insulating films 14, 33, and 37. The insulating film 18 is, e.g., a silicon oxide film (which may be referred to as an HTO film hereinafter) formed by using a high temperature oxidation (HTO) method (a film forming technique based on a reduced pressure CVD method). As a result, the side surfaces of the block layers 16 of the memory cell transistors MT are completely covered with the HTO film 18. It is to be noted that setting a film forming temperature (a substrate temperature in this example) in the HTO method to, e.g., 750° C. or above is desirable. However, when using a metal material, e.g., TaN as a material for the control gate electrodes 17 and the gate electrodes 20, setting the film forming temperature to a temperature lower than 750° C. is desirable.

Here, a silicon oxide film (which may be simply referred to as a TEOS film hereinafter) formed of a silicon compound containing nitrogen or oxygen as a material, e.g., an SiN film, SiON film, or a Tetra-Ethoxy silane (TEOS) may be used in place of the HTO film as the insulating film 18, and using a material which can be readily subjected to film thickness control is preferable. As a material of the insulating film 18, a material that can sufficiently ensure an etching selective ratio with respect to mask materials 41 to 43, which will be explained with reference to FIGS. 6, 7, and 8, can suffice. For example, as the insulating film 18, when using a photoresist as the mask materials 41 to 43, a material which is hardly etched under etching conditions at the time of removing the photoresist based on wet etching can suffice. In this example, setting the selective ratio to 1:100 or above is desirable. That is, it is desirable for a speed at which the insulating film 18 is etched to be equal to or below $\frac{1}{100}$ of a speed at which the mask materials 41 to 43 are etched. The following explains why. That is, when using a photoresist as the mask materials 41 to 43, a film thickness of the photoresist becomes 1 μm or above. As will be explained later, the film thickness of the insulating film 18 is in the order of nm. Therefore, the insulating film 18 is removed together with the photoresist unless the selective ratio of at least 1:100 is provided with respect to the photoresist.

The film thickness of the insulating film 18 is, e.g., approximately 2 to 10 nm. The reason why the minimum value of the film thickness is 2 nm is that a limit value that enables film thickness control is 2 nm when considering an incubation time. It is to be noted that incubation time means the time required to form an initial layer that becomes a "nucleus" of growth at an initial stage of film growth. Further, the reason why the maximum value of the film thickness is 10 nm is as follows. That is, each interval between the gate electrodes of the memory cell transistors MT adjacent to each other has been reduced to 30 to 40 nm or below because of a demand for high integration. For example, if each interval between the gate electrodes adjacent to each other is 25 nm and a film thickness of the insulating film 18 is 10 nm, a frontage width for later-explained ion implantation at the time of forming source/drain regions is 5 nm. That is, a distance (a width) between the insulating films 18 adjacent to each other is 5 nm, and an impurity is implanted into the p-type well region 12 through this region having the width of 5 nm. At this time, it can be considered that the minimum width necessary of the region for ion implantation is 5 nm. Therefore, the maximum value of the film thickness of the insulating film 18 is 10 nm.

Figure 6:
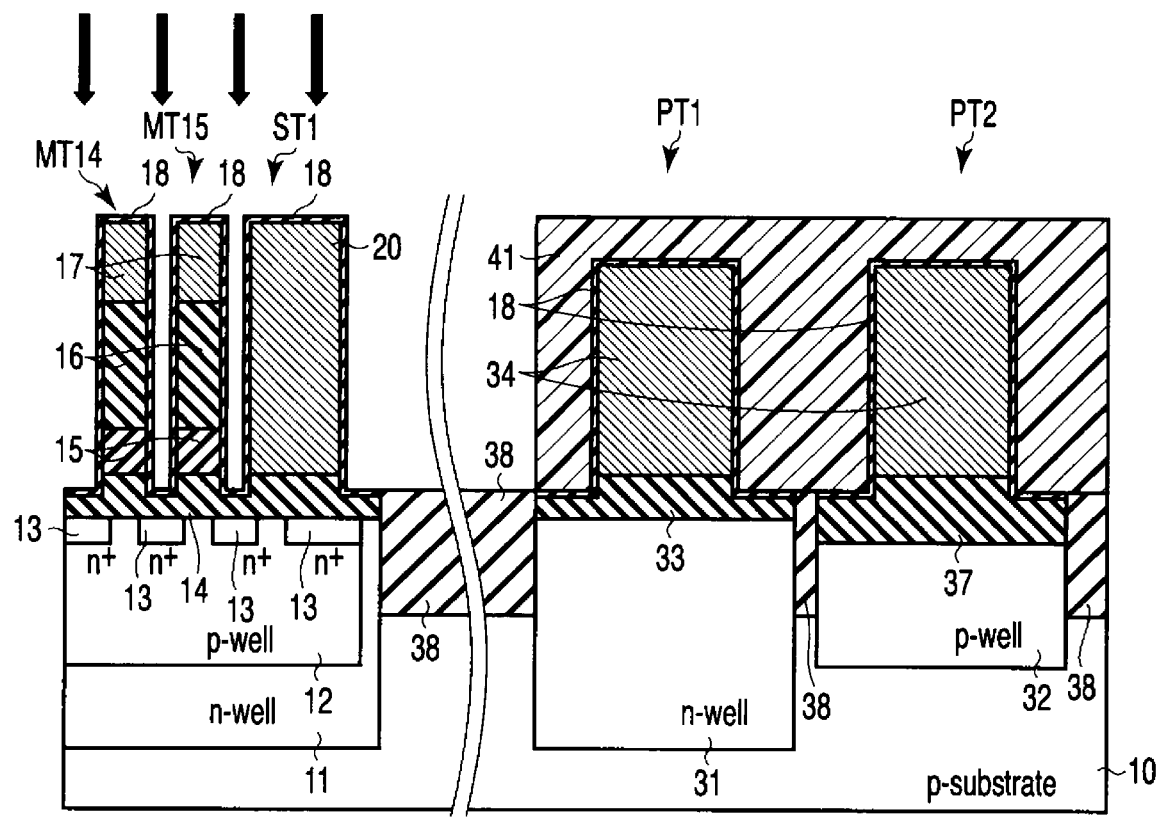
FIG. 6 is a cross-sectional view for explaining a third manufacturing step of the NAND type flash memory according to the first embodiment.

Then, as shown in FIG. 6, a mask material, e.g., a photoresist is formed on the p-type semiconductor substrate 10, and the photoresist in the region where the memory cell array 1 is planned to be formed is removed based on photolithography. Furthermore, in a state that a region where the peripheral transistors PT1 and PT2 are planned to be formed is masked with a photoresist 41, the $n^+$-type impurity diffusion layer 13 that functions as source/drain regions of the memory cell transistors MT and the selective transistors ST1 and ST2 is formed. That is, an n-type impurity is ion-implanted into portions between the gate electrodes of the memory cell transistors MT adjacent to each other, between the gate electrodes of the memory cell transistor MT and the selective transistor ST1 or ST2, between the gate electrodes 20 of the selective transistors ST1 and ST1 adjacent to each other, and between the gate electrodes 20 of the selective transistors ST2 and ST2 adjacent to each other. At this time, the gate electrodes of the memory cell transistors MT, the gate electrodes 20 of the selective transistors ST1 and ST2, and the insulating film 18 function as masks for ion implantation. After ion implantation, the photoresist 41 covering the peripheral transistors PT1 and PT2 is incinerated by, e.g., ashing, and further subjected to wet etching which uses, e.g., a mixed solution containing $H_2SO_4$ and $H_2O_2$ (which will be referred to as an SH liquid hereinafter). In this wet etching, the block layer 16 of each memory cell transistor MT is protected by the insulating film 18. In other words, wet etching is carried out under conditions where the photoresist 41 is sufficiently etched and the insulating film 18 is not substantially etched.

Figure 7:
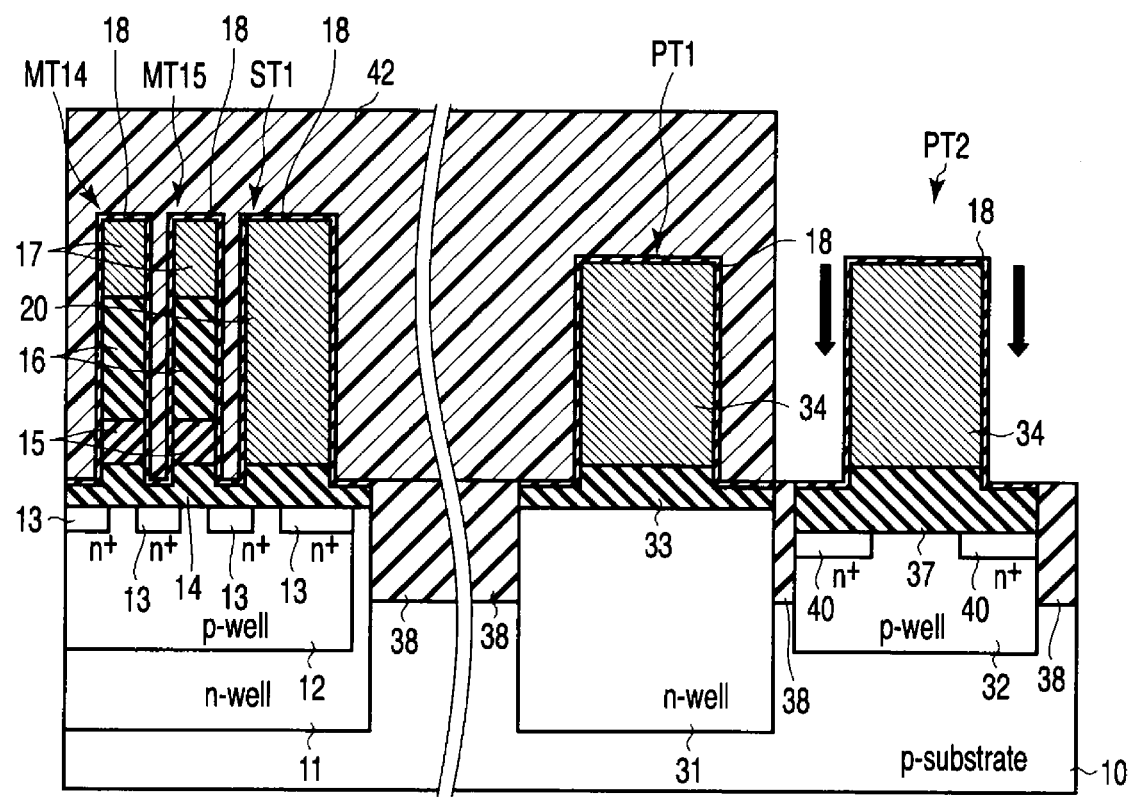
FIG. 7 is a cross-sectional view for explaining a fourth manufacturing step of the NAND type flash memory according to the first embodiment.

Then, as shown in FIG. 7, a mask material, e.g., a photoresist is formed on the p-type semiconductor substrate 10, and the photoresist in a region where the peripheral transistor PT2 is planned to be formed is removed based on photolithography. Moreover, in a state that regions where the memory cell transistors MT, the selective transistors ST1 and ST2, and the peripheral transistor PT1 are planned to be formed are masked with a photoresist 42, the $n^+$-type impurity diffusion layer 40 that functions as source/drain regions of the peripheral transistor PT2 is formed. That is, an n-type impurity is ion-implanted into a surface region of the p-type well region 32. At this time, the gate electrode 34 of the peripheral transistor PT2 and the insulating film 18 function as masks for ion implantation. After ion implantation, the photoresist 42 is incinerated and subjected to wet etching which uses the SH liquid, thereby delaminating the photoresist 42. In this wet etching, likewise, the block layer 16 of each memory cell transistor MT is protected by the insulating film 18. That is, wet etching is carried out under conditions that the photoresist 42 is sufficiently etched and the insulating film 18 is not substantially etched.

Figure 8:
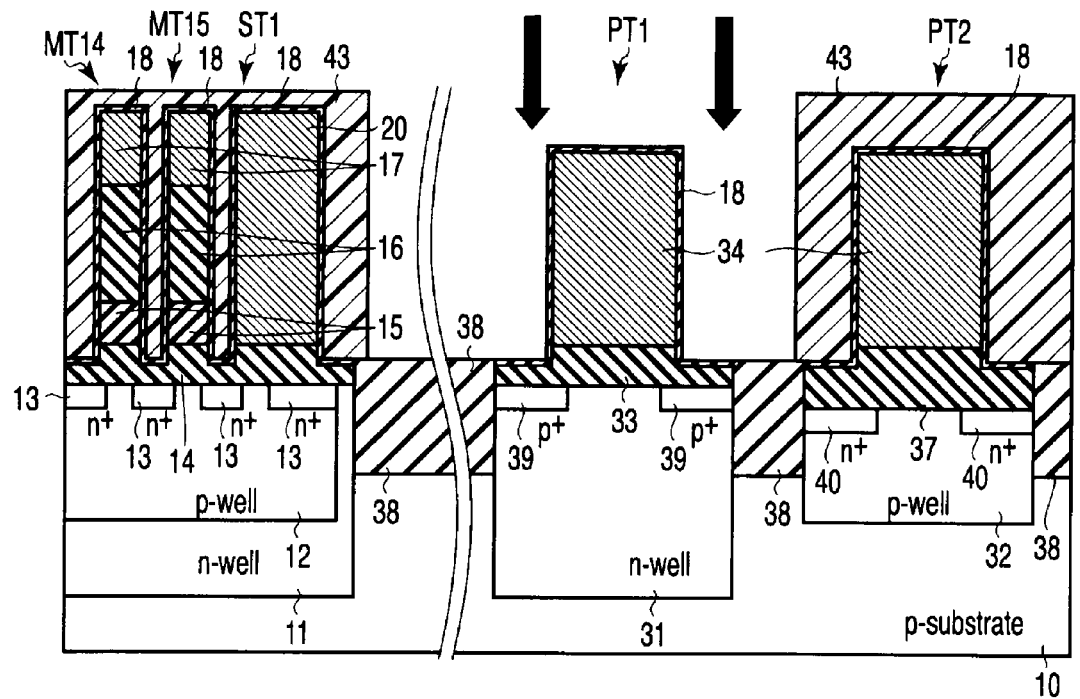
FIG. 8 is a cross-sectional view for explaining a fifth manufacturing step of the NAND type flash memory according to the first embodiment.

Then, as shown in FIG. 8, a mask material, e.g., a photoresist is formed on the p-type semiconductor substrate 10, and the photoresist in a region where the peripheral transistor PT1 is planned to be formed is removed based on the photolithography technology. Additionally, in a state that regions where the memory cell transistors MT, the selective transistors ST1 and ST2, and the peripheral transistor PT2 are planned to be formed are masked with a photoresist (a mask material) 43, the $p^+$-type impurity diffusion layer 39 that functions as source/drain regions of the peripheral transistor PT1 is formed. That is, a p-type impurity is ion-implanted into a surface region of the n-type well region 31. At this time, the gate electrode 34 of the peripheral transistor PT1 and the insulating film 18 function as masks for ion implantation. After ion implantation, the photoresist 43 is incinerated and subjected to wet etching which uses the SH liquid, thereby delaminating the photoresist 43. In this wet etching, likewise, the block layer 16 of each memory cell transistor MT is protected by the insulating film 18. That is, wet etching is carried out under conditions that the photoresist 43 is sufficiently etched and the insulating film 18 is not substantially etched.

Figure 9:
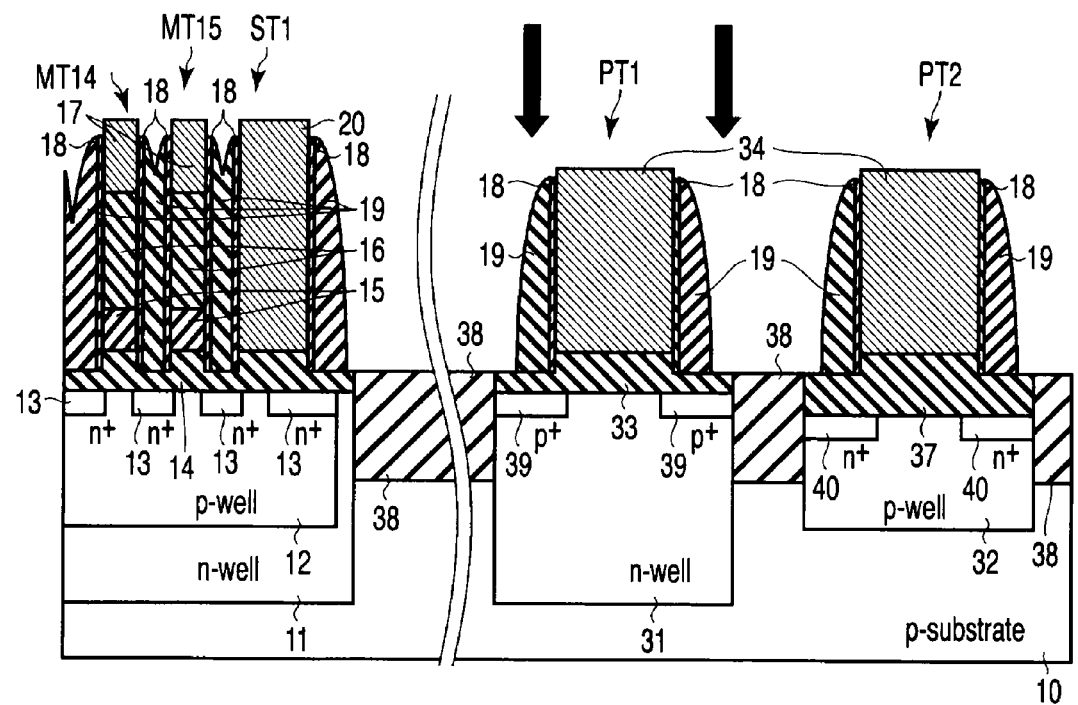
FIG. 9 is a cross-sectional view for explaining a sixth manufacturing step of the NAND type flash memory according to the first embodiment.

Further, as shown in FIG. 9, the insulating film 18 on the upper surfaces of the gate electrodes of the memory cell transistors MT, the upper surfaces of the gate electrodes 20 of the selective transistors ST1 and ST2, the upper surfaces of the gate electrodes 34 of the peripheral transistors PT1 and PT2, and the upper surfaces of the gate insulating films 14, 33, and 37 is removed. Thereafter, the insulating film 19 is formed on the p-type semiconductor substrate 10 to cover the gate electrodes of the memory cell transistors MT, the gate electrodes 20 of the selective transistors ST1 and ST2, and the gate electrodes 34 of the peripheral transistors PT1 and PT2. Furthermore, the insulating film 19 is left on sidewall portions alone of the gate electrodes of the memory cell transistors MT, the gate electrodes 20 of the selective transistors ST1 and ST2, and the gate electrodes 34 of the peripheral transistors PT1 and PT2 while exposing the upper surfaces of the control gate electrodes 17 and the gate electrodes 20 and 34 by etching back the insulating film 19 based on, e.g., RIE.

It is to be noted that, in FIG. 9, each region between the gate electrodes of the memory cell transistors MT adjacent to each other and each region between the gate electrode of the memory cell transistor MT and the gate electrode 20 of the selective transistor ST1 or ST2 are completely filled with the insulating film 19. However, these regions do not have to be completely filled, and the surface of the gate insulating film 14 may be partially exposed.

Subsequently, after forming a metal layer on the control gate electrodes 17 and the gate electrodes 20 and 34, a heat treatment is performed to form a metal silicide layer on the respective upper surfaces of the control gate electrodes 17, the gate electrodes 20, and the gate electrodes 34.

With the above-explained steps, the memory cell transistors MT, the selective transistors ST1 and ST2, and the peripheral transistors PT1 and PT2 are brought to completion. Subsequently, the interlayer insulating film 21 that covers the respective transistors is formed on the p-type semiconductor substrate 10, and the contact plugs CP1 and CP2 and the metal wiring layers 22 and 23 are formed in the interlayer insulating film 21. Furthermore, the interlayer insulating films 24 and 25 are formed on the interlayer insulating film 21, and the contact plug CP3 reaching the metal wiring layer 23 is formed in the interlayer insulating films 24 and 25. Then, the metal wiring layer 26 that is in contact with the contact plug CP3 is formed on the interlayer insulating film 25, and the interlayer insulating film 27 is formed on the metal wiring layer 26, thereby bringing the structure depicted in FIG. 2 to completion.

According to the structure of this embodiment, the following effects (1) and (2) can be obtained.

(1) Operation characteristics of the semiconductor memory device can be improved.

According to the structure of this embodiment, the insulating film 18 that completely covers at least the side surfaces of the block layers 16 is formed on the sidewalls of the gate electrodes of the memory cell transistors MT. Therefore, in a manufacturing process, the side surfaces of the block layers 16 can be prevented from being etched, thus improving operation characteristics of the NAND type flash memory. This effect will be explained in detail hereinafter.

As memory cells conventionally used in a nonvolatile memory, e.g., a flash memory, two types, having different regions where electric charges are held, are known as typical memory cells. The first type has a structure where a charge storage layer formed of a conductive material is surrounded by an insulating film and data is held by changing a threshold voltage of each memory cell transistor based on a quantity of electric charges stored in this conductive material (which will be referred to as a floating gate (FG) type hereinafter). The second type has a structure where a threshold voltage of each memory cell transistor is changed based on a quantity of electric charges trapped in a charge storage layer (a trap film) formed of an insulator (a MONOS type).

The FG type structure has been conventionally widely used since the MONOS type structure is inferior in the point of charge holding characteristics, which is important as a function of a nonvolatile memory. However, as the size of a memory cell transistor has been reduced, as a result of both pursuit towards high integration and advancements in lithography technology, the following problems have become prominent in the FG type structure.

The first problem is a fluctuation in threshold values of memory cell transistors caused due to capacitance coupling between memory cell transistors adjacent to each other. In recent years, realization of multiple values by narrowing a threshold value distribution that is used to discriminate data in memory cell transistors has advanced in order to increase a storage capacity (a data amount) of a single memory cell transistor. Therefore, a margin of a shift in a threshold value of the memory cell transistor is reduced as compared with that of a binary value, and stored data is apt to be erroneously read due to capacitance coupling between the memory cell transistors adjacent to each other. Furthermore, since a coupling ratio must be maintained, a film thickness of each layer forming the FG type structure must be maintained to some extent. Therefore, when a distance between the memory cell transistors adjacent to each other is narrowed due to miniaturization, capacitance coupling between gate electrodes adjacent to each other is increased in inverse proportion to the distance between the memory cell transistors. It is to be noted that the coupling ratio is $C_R = C_{IPD}/(C_{IPD} + C_{OX})$. However, $C_{OX}$ is a gate insulating film capacitance between a charge storage layer and a semiconductor substrate, and $C_{IPD}$ is an insulating film capacitance between the charge storage layer and a control gate electrode.

The second problem is that, when a defect occurs even in a part of the insulating film surrounding the charge storage layer in the FG type structure, electric charges held in the charge storage layer flow out through this defect and data that should be held is lost. In the MONOS type structure, since electric charges are stored in the trap film itself, the same problem as that in the FG type structure does not occur.

Based on the above-explained problems, a memory cell transistor having the MONOS type structure that may possibly overcome drawbacks in the FG type structure has again attracted attention. However, the MONOS type structure likewise has the following problems.

As explained in the foregoing embodiment, not only the memory cell transistors MT but also the peripheral transistors PT1 and PT2 are formed on the p-type semiconductor substrate 10. Each of the peripheral transistors PT1 and PT2 is a transistor used in, e.g., the power supply voltage generation circuit 2, the row decoder 3, and the column decoder 4. Moreover, various kinds of operating voltage values, current values, and threshold values different from those in the memory cell transistors MT are required in the peripheral transistors PT1 and PT2. In order to realize this, in the peripheral transistors PT1 and PT2, the type of impurity, energy when implanting the impurity, an amount of the impurity, and others at the time of, e.g., forming source/drain regions vary depending on necessary characteristics.

In particular, an impurity that is implanted to improve a breakdown voltage of the transistor or an impurity implanted to suppress a short channel effect is implanted into the silicon substrate after processing each gate electrode. The type of this impurity and implantation energy vary in accordance with the type of each transistor. Therefore, regions other than those where the impurity is implanted must be masked with a photoresist by using the photolithography technology in accordance with the number of types of the transistor. Therefore, after gate processing, application and delamination of the photoresist are repeated every time the impurity is implanted. Delamination of the photoresist is carried out by incineration (ashing) and wet etching after performing exposure.

At this time, an etchant (the SH liquid) that is generally utilized to delaminate the photoresist is used to etch not only the photoresist but also the block layer (e.g., $Al_2O_3$) 16. Therefore, the gate electrode, especially the block layer 16 of each memory cell transistor MT is etched every time etching for delamination of the photoresist is carried out. This state will now be explained with reference to FIG. 10.

Figure 10:
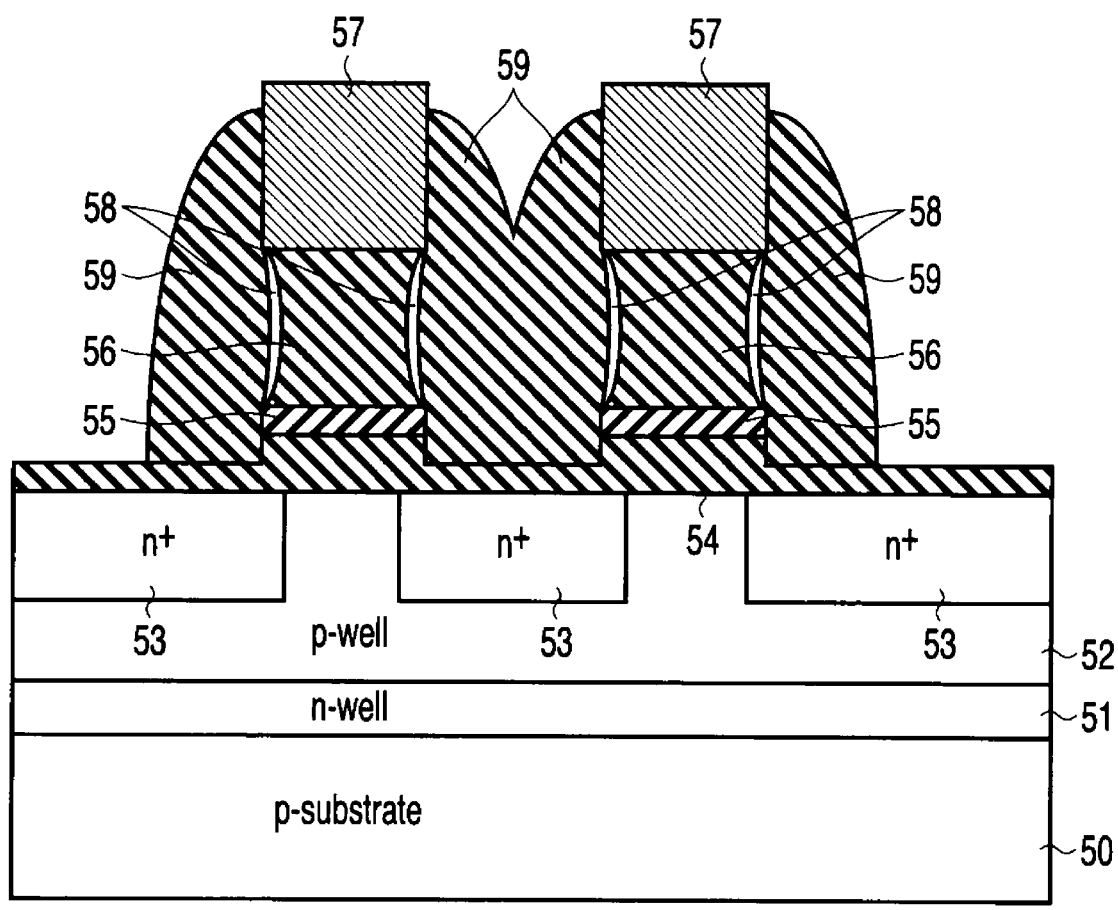
FIG. 10 is a cross-sectional view showing a structural example of MOS transistors each having a MONOS type structure.

FIG. 10 is a cross-sectional view of an MOS transistor having a MONOS type structure. As shown in the drawing, the MONOS type structure includes a charge storage layer (an SiN film) 55 formed on a gate insulating film 54, a block film ($Al_2O_3$) 56 formed on the charge storage layer 55, and a control gate electrode 57 formed on the block film 56. When this structure is exposed to wet etching which uses the SH liquid, a side surface of each block film 56 is etched and the side surface has a shape curved toward the inner side of each gate electrode, as shown in the drawing.

For example, in a case where a width of each gate electrode (a length in a lateral direction in FIG. 10) is 40 nm or below, when an etching amount of the block film 56 exceeds 5 nm, a width of the block film 56 becomes 30 nm or below. The etching amount of the block film 56 based on wet etching is determined based on a length and the number of times of wet etching, and it is fixed even if a dimension of the gate electrode is reduced. Therefore, when the dimension of the gate electrode will be reduced in the future, there may occur a problem that a percentage of the width of the block film 56 with respect to the dimension of the gate electrode is decreased and the control gate electrode 57 falls off the block film 56. Additionally, when the block film 56 is etched, capacitance coupling between the control gate electrode 57 and the charge storage layer 55 is reduced, and the data writing speed and data erasing speed are lowered.

Further, when an insulating film 59 is formed on a sidewall of each gate electrode, a gap 58 may be generated between the block film 56 and the insulating film 59. Generation of this uncontrollable gap 58 may become a factor of fluctuations in characteristics in the respective MOS transistors.

As explained above, as a means for preventing the block film 56 from being etched, there is a method of forming the block film 56 and then performing annealing at a high temperature of, e.g., 1000° C. or above. When this annealing is carried out, resistance of the block film 56 against etching can be improved. However, avoiding annealing at a high temperature is desirable in the light of thermal history. That is because annealing at a high temperature may vary a concentration profile of an impurity already implanted in a well and a channel.

In this regard, according to the structure of this embodiment, for example, as shown in FIG. 5, forming the insulating film 18 can solve the above-explained problem. That is, in this embodiment, the insulating film 18 is formed on the sidewall of the block layer 16. As a result, in the manufacturing steps shown in FIGS. 6 to 8, wet etching for removing the photoresists 41 to 43 is carried out in a state where the block layer 16 is protected by the insulating film 18. Therefore, the block layer 16 can be prevented from being etched without over 1000 degrees centigrade annealing the block layer 16.

Accordingly, the control gate electrode 17 can be prevented from falling off, and annealing at a high temperature becomes no longer necessary. Therefore, a process yield of the NAND type flash memory can be improved. For example, an impurity can be prevented from being diffused in the well or the channel. Further, a reduction in capacitance coupling between the control gate electrode 17 and the charge storage layer 15 can be suppressed, and a decrease in a data writing speed and a data erasing speed can be also suppressed. Moreover, a gap can be prevented from being generated between the insulating film 19 and the block layer 16, thus suppressing occurrence of fluctuations in characteristics of the memory cell transistors.

Furthermore, in the MONOS type structure, increasing a current flowing through each memory cell transistor MT is desirable. Therefore, it is necessary to increase a capacitance of the lamination layer structure including the block layer 16, the charge storage layer 15, and the gate insulating film 14 per unit area as much as possible. In order to realize this increase, it is desirable to reduce an equivalent oxide thickness of the block layer 16 as much as possible within allowable limits in degradation in charge holding characteristics of the block layer 16 involved by charge leak from the block layer 16 side. The equivalent oxide thickness (EOT) means a film thickness obtained when a material is reduced to a silicon oxide film. That is, the EOT can be decreased when a material having a higher dielectric constant than, e.g., a silicon oxide film is used. If, as shown in FIG. 10, the side surface of the block film 56 is etched and the insulating film 59 is present in this region, the dielectric constant of the block film 56 is substantially reduced and the equivalent oxide thickness is increased. However, in this embodiment, for example, as shown in FIG. 9, since the insulating film 18 protects the surface of the block layer 16 from being etched, an increase in equivalent oxide thickness of the block layer 16 can be avoided.

Incidentally, it is desirable to form the insulating film 18 on not only the sidewalls of the gate electrodes of the memory cell transistors MT but also the sidewalls of the gate electrodes 20 of the selective transistors ST1 and ST2 and the sidewalls of the gate electrodes 34 of the peripheral transistors PT1 and PT2 like this embodiment. That is because the gate electrodes 20 and 34 can be thereby prevented from being subjected to unnecessary wet etching.

(2) Manufacturing accuracy can be improved while facilitating manufacturing steps of the NAND type flash memory.

In the structure according to this embodiment, the respective insulating films 18 for the memory cell transistors MT, the selective transistors ST1 and ST2, and the peripheral transistors PT1 and PT2 are simultaneously formed. Therefore, the effect (1) can be obtained while suppressing an increase in the number of manufacturing steps to the minimum.

Moreover, the HTO film is used as the insulating film 18. Therefore, a film thickness of the insulating film 18 can be easily controlled. This leads to the following effect. That is, each gate electrode and the insulating film 18 function as masks for ion implantation when forming the impurity diffusion layers 13, 39, and 40 that serve as the source/drain regions. Therefore, manufacturing accuracy of the source/drain regions is dependent on a width of each gate electrode and a film thickness of the insulating film 18. In particular, a width of the gate electrode in a recent NAND type flash memory has become very small, and a problem, e.g., the short channel effect becomes prominent when, e.g., a distance between the source region and the drain region is too small.

In this regard, according to the structure of this embodiment, presence of the insulating film 18 can sufficiently assure the distance between the source region and the drain region as compared with a case where the insulating film 18 is not present. Therefore, forming the insulating film 18 enables not only protecting the block layer 16 but also accurately setting a distance of the impurity diffusion layer 13, 39, or 40 from an end portion of the gate electrode. Therefore, characteristics of the NAND type flash memory can be improved.

Second Embodiment

Figure 11:
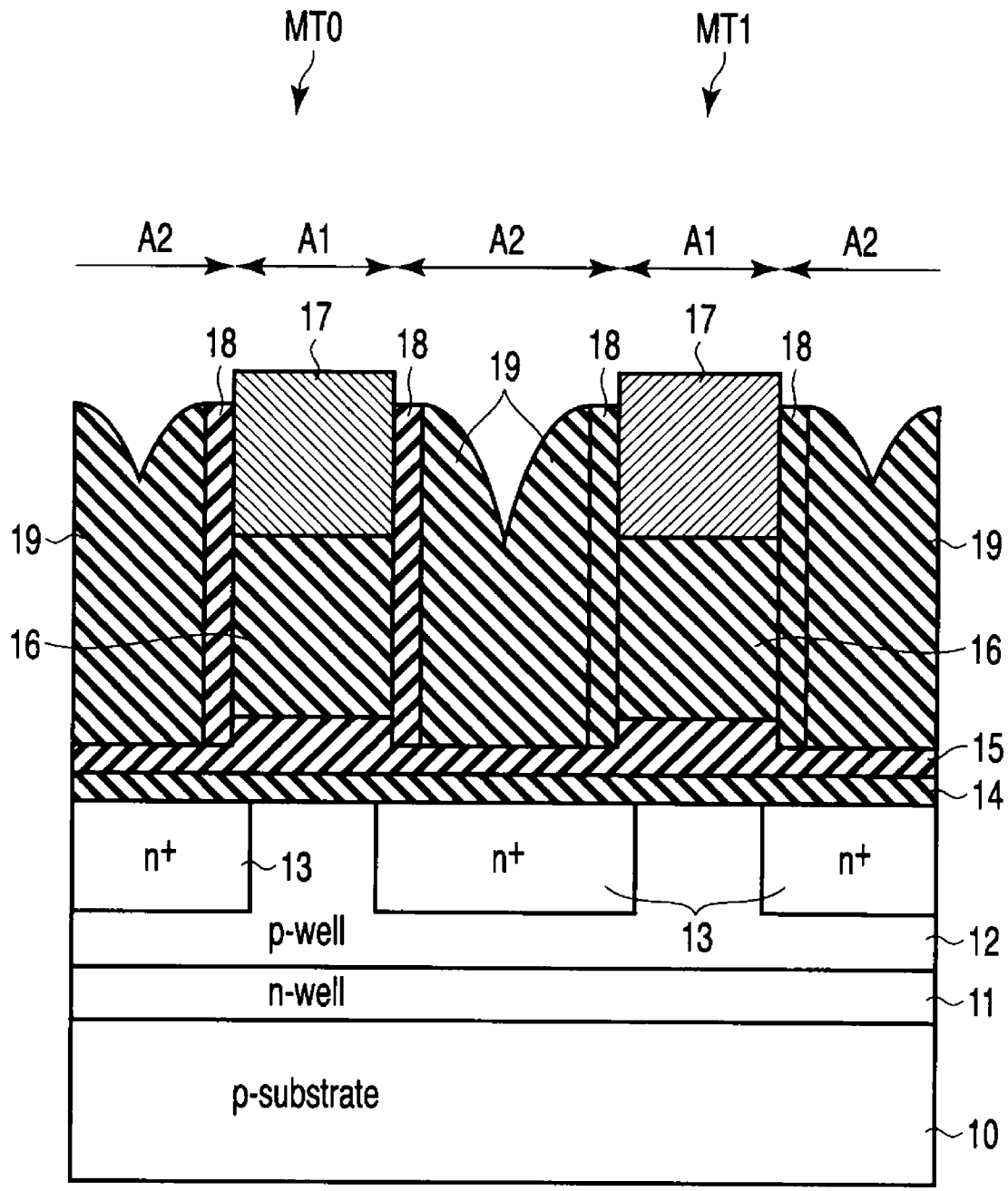
FIG. 11 is a cross-sectional view showing a structural example of memory cell transistors in a semiconductor memory device (a NAND type flash memory) according to a second embodiment of the present invention.

A manufacturing method of a semiconductor memory device according to a second embodiment of the present invention will now be explained. According to this embodiment, in the MONOS type structure of the first embodiment, the charge storage layers 15 depicted in FIG. 2 are connected between the neighboring memory cell transistors MT in common. FIG. 11 is a cross-sectional view of memory cell transistors MT in a NAND type flash memory according to this embodiment, and memory cell transistors MT0 and MT1 are depicted as an example. Of course, other memory cell transistors MT2 to MT15 have the same structure.

As shown in the drawing, in each memory cell transistor MT according to this embodiment, insulating films 15 that function as charge storage layers are connected between the neighboring memory cell transistors MT in common with respect to the structure depicted in FIG. 2 explained in the first embodiment. Other structures are the same as those in the first embodiment. Therefore, points different from the first embodiment alone will be explained with reference to FIG. 11.

For example, a region where a control gate electrode 17 is formed will be referred to as A1, and a region where the control gate electrode 17 is not formed will be referred to as A2. Then, the insulating film 15 is formed on not only the region A1 but also a gate insulating film 14 in the region A2, and the insulating films 15 in both the regions A1 and A2 are connected with each other. However, the insulating film 15 in the region A2 does not substantially function as the charge storage layer, and the insulating film 15 in the region A1 alone serves as the charge storage layer. Additionally, an insulating film 19 is formed on the insulating film 15 in the region A2 alone.

In the example shown in FIG. 11, a film thickness of the insulating film 15 varies depending on the region A1 and the region A2, and the film thickness in the region A1 is larger than the film thickness in the region A2. Therefore, a step is generated on a surface of the insulating film 15 at a boundary portion between the region A1 and the region A2, and an insulating film 18 is also formed on a sidewall of the insulating film 15 at this step portion. Other structures are as explained in the first embodiment.

In regard to manufacturing steps of the structure according to this embodiment, it is good enough to stop etching of the insulating film 15 halfway through a patterning step of each gate electrode in FIG. 4 explained in the first embodiment. Other manufacturing steps are the same as those in the first embodiment. Of course, etching may be stopped on an upper surface of the insulating film 15. In this case, the film thickness of the insulating film 15 is the same in both the region A1 and the region A2.

As explained in this embodiment, even in the NAND type flash memory in which the plurality of memory cell transistors MT share the charge storage layer 15, the effects (1) and (2) explained in the first embodiment can be obtained.

That is, in the structure according to this embodiment, as shown in FIG. 11, the charge storage layers 15 are connected between the memory cell transistors MT adjacent to each other. In this case, like the first embodiment, each block layer 16 is protected by the insulating film 18. As a result, even if the step using photolithography and wet etching is repeated the necessary number of times, the surface of each block layer 16 is not etched, and the effects (1) and (2) of the first embodiment can be obtained.

Further, in this embodiment, the charge storage layers 15 are connected to be shared by the memory cell transistors MT adjacent to each other. However, in the MONOS type structure, since the charge storage layer 15 is formed of an insulating material, electric charges do not flow into the charge storage layer 15 of one of the memory cell transistors MT adjacent to each other. As a result, it is considered that the same operation characteristics as those in the first embodiment can be obtained.

However, in this embodiment, when forming source/drain regions of each memory cell transistor MT, an impurity is implanted into not only the gate insulating film 14 but also the p-type well region 12 through the charge storage layer 15. Then, it can be considered that an ion seed is diffused at the ion implantation step and forming the source/drain regions as designed becomes difficult. Furthermore, it is also considered that electric charges are trapped in the charge storage layer 15 in the region A2, which degrade characteristics of each memory cell transistor MT in some cases. Therefore, when there is the above-explained concern, adopting the structure explained in the first embodiment is desirable.

Third Embodiment

A manufacturing method of a semiconductor memory device according to a third embodiment of the present invention will now be explained. In this embodiment, the MONOS type structure explained in the first embodiment is applied to a NOR type flash memory.

Figure 12:
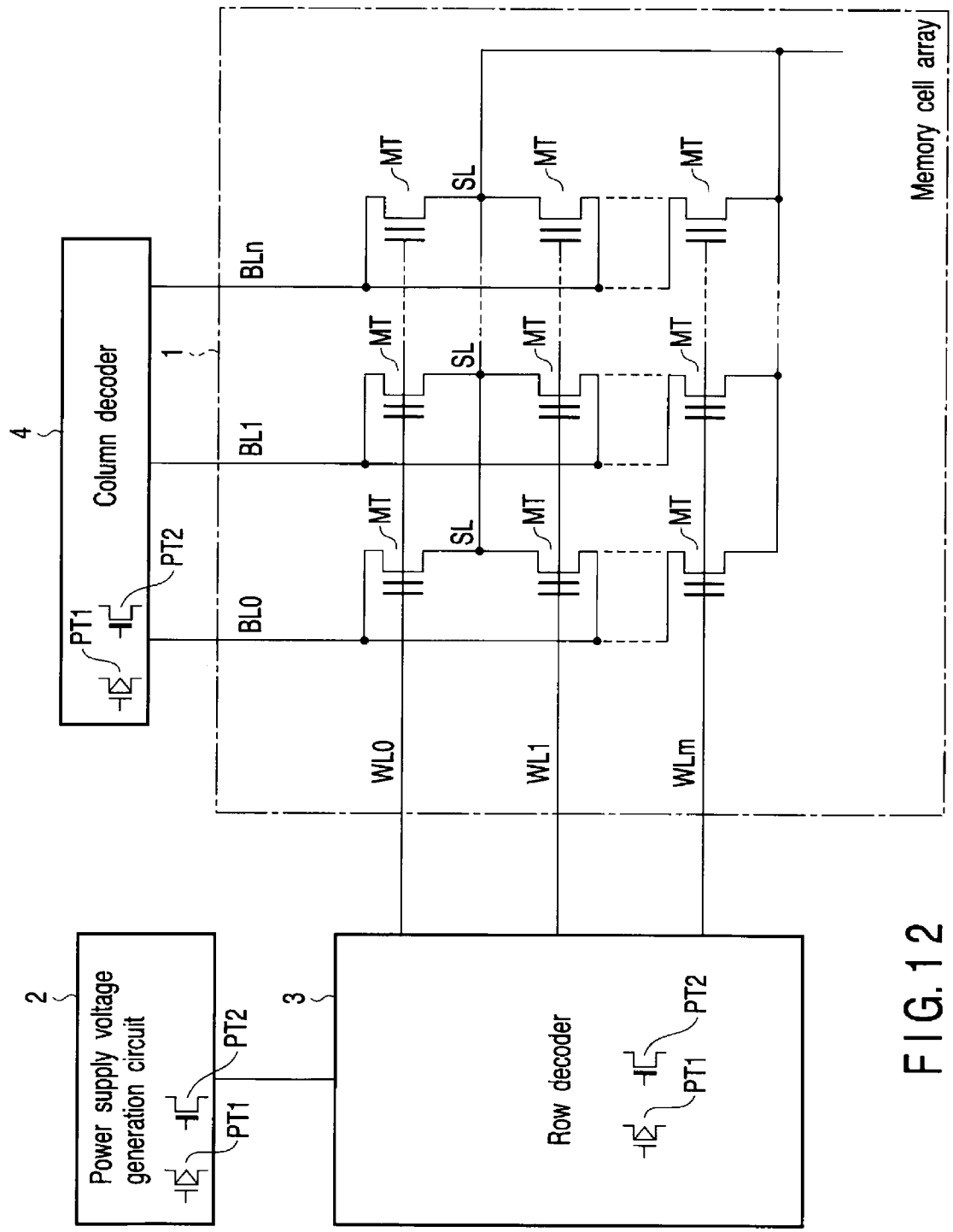
FIG. 12 is a block diagram showing a structural example of a semiconductor memory device (a NOR type flash memory) according to a third embodiment of the present invention.

FIG. 12 is a block diagram showing a NOR type flash memory according to this embodiment. As shown in the drawing, the NOR type flash memory according to this embodiment includes a memory cell array 1, a power supply voltage generation circuit 2, a row decoder 3, and a column decoder 4. Since the power supply voltage generation circuit 2, the row decoder 3, and the column decoder 4 are the same as those explained in the first embodiment, an explanation thereof will be omitted, and the memory cell array 1 will be described below.

As shown in the drawing, the memory cell array 1 includes a plurality of memory cell transistors MT arranged in a matrix. Each memory cell transistor MT includes a MONOS type structure having a charge storage layer (e.g., an insulating film) formed on a semiconductor substrate through a gate insulating film, an insulating film which has a higher dielectric constant than the charge storage layer and is formed on this insulating film, and a control gate electrode formed on this insulating film having a high dielectric constant. That is, this memory cell transistor MT has the same structure as the memory cell transistor MT explained in the first or second embodiment. A drain region of each memory cell transistor MT provided in the same column is connected with one of bit lines BL0 to BLn in common, and the control gate electrode of each of the memory cell transistors provided in the same row is connected with one of word lines WL0 to WLm in common. Moreover, a source region of each memory cell transistor MT is connected with a source line SL in common. That is, this memory cell array 1 has a structure in which the memory cell transistors MT explained in the first embodiment are arranged in a matrix and the bit line BL and the word line BL are connected in accordance with each memory cell transistor MT.

In this NOR type flash memory, the effects (1) and (2) explained in the first embodiment can be likewise obtained.

As explained above, in the case of the semiconductor memory device according to the first to third embodiments, the insulating film, e.g., an HTO film that can assure a selective ratio with respect to a photoresist at the time of wet etching is formed on a sidewall of the block layer of each memory cell transistor having the MONOS type structure. Therefore, since the block layer can be protected by the insulating film during wet etching, the block layer can be prevented from being etched.

Therefore, it is possible to prevent each control gate electrode in the MONOS type structure from falling off or prevent the equivalent oxide thickness of each block layer from being increased, thereby improving characteristics of the semiconductor memory device.

It is to be noted that the example where the film thickness of the insulating film 18 is 2 nm or above has been explained in the foregoing embodiments. However, providing the insulating film 18 on the side surface of each block layer can suffice, and the insulating film 18 can function as a protective film for the block layer even if the film thickness of the insulating film 18 is less than 2 nm.

Additionally, the example where the HTO film, the SiN film, the SiON film, or the TEOS film is used as a material of the insulating film 18 has been explained in the foregoing embodiments. However, in the light of operation characteristics of the semiconductor memory device, using the HTO film or the TEOS film having a lower dielectric constant is desirable. In particular, in the NAND type flash memory, realization of high integration has been demanded in recent years, and miniaturization of wiring lines including transistors has advanced with this demand. For example, a gate electrode is formed using minimum processing dimensions, and a width of a gate electrode interval is made as small as possible. Therefore, an influence of a parasitic capacitance between gate electrodes prominently appears, and characteristics as a flash memory are reduced due to this influence. Thus, using an HTO film or TEOS film as a material of the insulating film 18 enables reducing the parasitic capacitance. As a result, interference between the memory cell transistors MT adjacent to each other can be suppressed, thus improving operation characteristics of the flash memory. Furthermore, as a material of the insulating film 18, a material having a selective ratio of 1:100 or above with respect to the mask materials 41 to 43 at the time of wet etching of the mask materials 41 to 43 can suffice. Therefore, when a material other than the photoresist is used as each of the mask materials 41 to 43, it is good enough to appropriately select a material of the insulating film 18 in accordance with this material.

The insulating film 18 can be a side-wall oxide film formed by use of the Atomic Layer Deposition (ALD) method, which enables film formation at a temperature in the range of 350 to 550 degrees.

The example where polysilicon is used as a material for the control gate electrode 17 and the gate electrodes 20 and 34 has been explained in the foregoing embodiments. However, the present invention is not restricted to polysilicon, and a metal or TaN may be used as the material, for example. However, since TaN has a higher resistance than polysilicon, using a metal laminated film containing, e.g., polysilicon, a metal, or TaN is desirable. To be more specific, the control gate electrode 17 and the gate electrodes 20 and 34 are not limited to the polysilicon layers described above; they may be formed of a stacked film made up of a metal nitride film and a polyslicon film, a metal nitride film, a metal film, or the like. It should be noted that the metal film is made of W, for example, and the metal nitride film is made of WN, TaN or TiN, for example.

Figure 13:
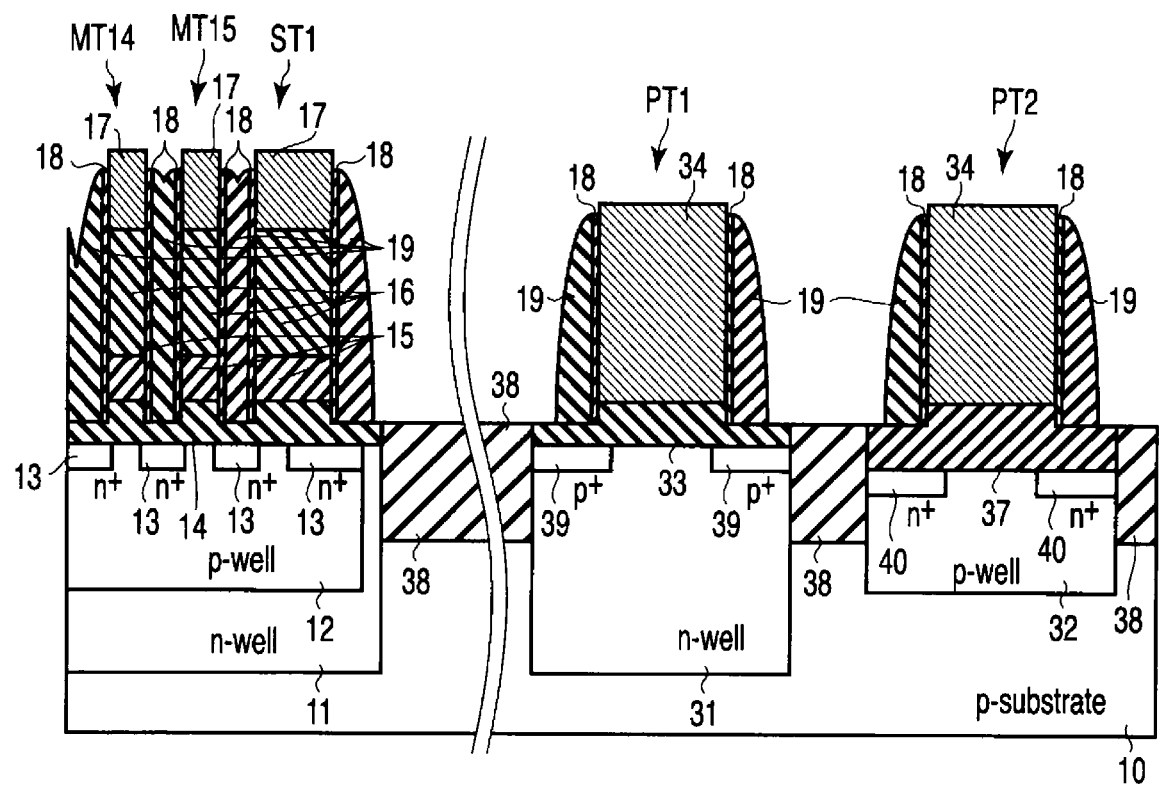
FIG. 13 is a cross-sectional view showing another structural example of the NAND type flash memory according to the first embodiment.

Additionally, the gate electrode of each of the selective transistors ST1 and ST2 may have the MONOS type structure, like the memory cell transistor MT, as shown in FIG. 13. FIG. 13 is a cross-sectional view of a NAND type flash memory according to a modification of the first embodiment.

As shown in the drawing, a gate electrode of each of selective transistors ST1 and ST2 has a lamination layer structure including a charge storage layer 15, a block layer 16, and a control gate electrode 17. Further, a side surface of the block layer 16 is covered with an insulating film 18. In this structure, injecting electric charges into the charge storage layer 15 enables setting a threshold voltage of each of the selective transistors ST1 and ST2 to an optimum value. Of course, in this structure, the charge storage layers 15 adjacent to each other may be likewise connected with each other as shown in, e.g., FIG. 11.

Furthermore, in this embodiment, the example where the insulating film 18 is formed on not only the side surface of the block layer 16 but also the side surfaces of the charge storage layer 15 and the control gate electrode 17 has been explained. However, in the light of protection of the block layer 16, providing the insulating film 18 on the side surface of the block layer 16 alone is sufficient. However, when the insulating film 18 is also formed on the side surfaces of the charge storage layer 15 and the control gate electrode 17, these films can be protected from wet etching.

Moreover, in the foregoing embodiments, the NAND type flash memory and the NOR type flash memory have been explained as examples. However, for instance, the present invention can be also applied to a 3Tr-NAND type flash memory having a structure where the number of memory cell transistors is one in the NAND type flash memory. Additionally, the present invention can be also applied to a 2Tr type flash memory having a structure where the selective transistor ST1 on the drain region side is eliminated in the 3Tr-NAND type flash memory, and it can be extensively applied to general nonvolatile memories of a laminated gate structure.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A manufacturing method of a semiconductor memory device, comprising:
    forming a first gate electrode having a charge storage layer, a block layer, and a control gate electrode on a first region of a semiconductor substrate via a first gate insulating film;
    forming a second gate electrode on a second region of the semiconductor substrate via a second gate insulating film;
    forming a protective insulating film on side and upper surfaces of the first gate electrode, and on side and upper surfaces of the second gate electrode, by using a high temperature oxidation (HTO) method or an atomic layer deposition (ALD) method;
    forming a photoresist to cover the protective insulating film in the second region while exposing the protective insulating film in the first region;
    using the photoresist and the first gate electrode as masks to implant an impurity into the first region of the semiconductor substrate;
    removing the photoresist by wet etching which uses a mixed solution containing $H_2SO_4$ and $H_2O_2$, while permitting the protective insulating film to remain on the side and upper surfaces of the first gate electrode and on the side and upper surfaces of the second gate electrode;
    after removing the photoresist, removing the protective insulating film on the upper surface of the first gate electrode and the upper surface of the second gate electrode, while the protective insulating film on the side surface of the first gate electrode and on the side surface of the second gate electrode remain; and
    after removing the photoresist, forming side walls on the side surface of the first gate electrode, and on the side surface of the second gate electrode via the protective insulating film,
    wherein the protective insulating film has an etching selective ratio of 1:100 or above with respect to the photoresist under wet etching conditions using the mixed solution, and
    the block layer is one of a high-dielectric-constant film having a higher dielectric constant than a silicon oxide film and a laminated film including the silicon oxide film and the high-dielectric-constant film.

2. The method according to claim 1, wherein the forming a first gate electrode includes:
    forming a first insulating film functioning as the charge storage layer on the first gate insulating film;
    forming a second insulating film functioning as the block layer on the first insulating film;
    forming a conductive film functioning as the control gate electrode on the second insulating film; and
    patterning the conductive film and the first and second insulating films into a pattern of the first gate electrode, and
    the patterning is performed until part of the first gate insulating film is removed.

3. The method according to claim 2, wherein the first gate insulating film is thicker at a position below the first gate electrode and thinner at other positions.

4. The method according to claim 1, wherein the forming a first gate electrode includes:
    forming a first insulating film functioning as the charge storage layer on the first gate insulating film;
    forming a second insulating film functioning as the block layer on the first insulating film;
    forming a conductive film functioning as the control gate electrode on the second insulating film; and
    patterning the conductive film and the second insulating film into a pattern of the first gate electrode, and
    the patterning is performed until part of the first insulating film is removed.

5. The method according to claim 4, wherein the first insulating film is thicker at a position of the first gate electrode and thinner at other positions.

6. The method according to claim 1, wherein
    the high-dielectric-constant film is formed of at least one of $Al_2O_3$, MgO, SrO, SiN, BaO, TiO, $Ta_2O_5$, $BaTiO_3$, BaZrO, $ZrO_2$, $HfO_2$, $Y_2O_3$, ZrSiO, HfSiO, and LaAlO, and
    the laminated film has one of a structure where the silicon oxide film, the high-dielectric-constant film, and the silicon oxide film are sequentially laminated, a structure where the silicon oxide film and the high-dielectric-constant film are sequentially laminated, a structure where the high-dielectric-constant film and the silicon oxide film are sequentially laminated, and a structure where the high-dielectric-constant film, the silicon oxide film, and the high-dielectric-constant film are sequentially laminated.

7. The method according to claim 1, wherein a film thickness of the protective insulating film is 2 to 10 nm.

8. The method according to claim 1, further comprising forming a third gate electrode on the first region of the semiconductor substrate through the first gate insulating film,
    wherein the third gate electrode is formed of a conductive film functioning as the control gate electrode.

9. The method according to claim 1, further comprising forming a third gate electrode on the first region of the semiconductor substrate through the first gate insulating film,
    wherein the third gate electrode is formed of a first insulating film functioning as the charge storage layer, a second insulating film functioning as the block layer, and a conductive film functioning as the control gate electrode.

10. A manufacturing method of a semiconductor memory device, comprising:
forming a plurality of first gate electrodes each having a charge storage layer, a block layer, and a control gate electrode on a first region of a semiconductor substrate via a first gate insulating film;
forming a plurality of second gate electrodes on a second region of the semiconductor substrate via a second gate insulating film;
forming a protective insulating film on side and upper surfaces of the first gate electrodes, and on side and upper surfaces of the second gate electrodes, with spaces provided between side surfaces of the first gate electrodes, and between side surfaces of the second gate electrodes by using a high temperature oxidation (HTO) method or an atomic layer deposition (ALD) method;
forming a first photoresist to cover the protective insulating film in the second region while exposing the protective insulating film in the first region;
using the first photoresist and the plurality of first gate electrodes as masks to implant an impurity into the first region of the semiconductor substrate;
removing the first photoresist by wet etching which uses a mixed solution containing $H_2SO_4$ and $H_2O_2$, while permitting the protective insulating film to remain on the side and upper surfaces of the first gate electrodes and on the side and upper surfaces of the second gate electrodes;
forming a second photoresist to cover the protective insulating film in the first region while exposing the protective insulating film in the second region;
using the second photoresist and the plurality of second gate electrodes as masks to implant an impurity into the second region of the semiconductor substrate;
removing the second photoresist by wet etching which uses a mixed solution containing $H_2SO_4$ and $H_2O_2$, while permitting the protective insulating film to remain on the side and upper surfaces of the first gate electrodes and on the side and upper surfaces of the second gate electrodes;
after removing the first and the second photoresist, removing the protective insulating film on the upper surface of the first gate electrode and the upper surface of the second gate electrode, while the protective insulating film on the side surface of the first gate electrode and on the side surface of the second gate electrode remain; and
after removing the first and the second photoresist, forming side walls on the side surface of the first gate electrode, and on the side surface of the second gate electrode via the protective insulating film,
wherein the protective insulating film has an etching selective ratio of 1:100 or above with respect to the first and second photoresists under wet etching conditions using the mixed solution, and
the block layer is one of a high-dielectric-constant film having a higher dielectric constant than a silicon oxide film and a laminated film including the silicon oxide film and the high-dielectric-constant film.

11. The method according to claim 10, wherein the forming a plurality of first gate electrodes includes:
forming a first insulating film functioning as the charge storage layer on the first gate insulating film;
forming a second insulating film functioning as the block layer on the first insulating film;
forming a conductive film functioning as the control gate electrode on the second insulating film; and
patterning the conductive film and the first and second insulating films into patterns of the plurality of first gate electrodes, and
the patterning is performed until part of the first gate insulating film is removed.

12. The method according to claim 11, wherein the first gate insulating film is thicker at positions below the plurality of first gate electrodes and thinner at positions between the plurality of first gate electrodes.

13. The method according to claim 10, wherein the forming a plurality of first gate electrodes includes:
forming a first insulating film functioning as the charge storage layer on the first gate insulating film;
forming a second insulating film functioning as the block layer on the first insulating film;
forming a conductive film functioning as the control gate electrode on the second insulating film; and
patterning the conductive film and the second insulating film into patterns of the plurality of first gate electrodes, and
the patterning is performed until part of the first insulating film is removed.

14. The method according to claim 13, wherein the first insulating film is thicker at positions below the plurality of first gate electrodes and thinner at positions between the plurality of first gate electrodes.

15. The method according to claim 10, wherein
the high-dielectric-constant film is formed of at least one of $Al_2O_3$, MgO, SrO, SiN, BaO, TiO, $Ta_2O_5$, $BaTiO_3$, BaZrO, $ZrO_2$, $HfO_2$, $Y_2O_3$, ZrSiO, HfSiO, and LaAlO, and
the laminated film has one of a structure where the silicon oxide film, the high-dielectric-constant film, and the silicon oxide film are sequentially laminated, a structure where the silicon oxide film and the high-dielectric-constant film are sequentially laminated, a structure where the high-dielectric-constant film and the silicon oxide film are sequentially laminated, and a structure where the high-dielectric-constant film, the silicon oxide film, and the high-dielectric-constant film are sequentially laminated.

16. The method according to claim 10, wherein a film thickness of the protective insulating film is 2 to 10 nm.

17. The method according to claim 10, further comprising forming a third gate electrode on the first region of the semiconductor substrate through the first gate insulating film,
wherein the third gate electrode is formed of a conductive film functioning as the control gate electrode.

18. The method according to claim 10, further comprising forming a third gate electrode on the first region of the semiconductor substrate through the first gate insulating film,
wherein the third gate electrode is formed of a first insulating film functioning as the charge storage layer, a second insulating film functioning as the block layer, and a conductive film functioning as the control gate electrode.

19. The method according to claim 1, wherein the control gate electrode includes one of TaN, TiN and WN, and
the protective insulating film is formed at a temperature lower than 750° C.

20. The method according to claim 10, wherein the control gate electrode includes TaN, TiN, and WN, and
the protective insulating film is formed at a temperature lower than 750° C.

* * * * *